US006876592B2

(12) United States Patent
Takahashi et al.

(10) Patent No.: US 6,876,592 B2
(45) Date of Patent: Apr. 5, 2005

(54) SEMICONDUCTOR MEMORY DEVICE

(75) Inventors: Hiroyuki Takahashi, Tokyo (JP); Hideo Inaba, Tokyo (JP); Masatoshi Sonoda, Tokyo (JP); Yoshiyuki Kato, Tokyo (JP); Atsushi Nakagawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 35 days.

(21) Appl. No.: 10/220,951

(22) PCT Filed: Mar. 7, 2001

(86) PCT No.: PCT/JP01/01768

§ 371 (c)(1),
(2), (4) Date: Sep. 6, 2002

(87) PCT Pub. No.: WO01/67461

PCT Pub. Date: Sep. 13, 2001

(65) Prior Publication Data

US 2004/0114446 A1 Jun. 17, 2004

(30) Foreign Application Priority Data

Mar. 8, 2000 (JP) ........................................ 2000-063936
May 12, 2000 (JP) ........................................ 2000-140862
Feb. 28, 2001 (JP) ........................................ 2001-055202

(51) Int. Cl.$^7$ ................................................ G11C 7/00
(52) U.S. Cl. ...................... 365/222; 365/195; 365/233.5
(58) Field of Search ................................ 365/222, 195, 365/189.04, 189.08, 230.06, 233.5, 200, 220, 221

(56) References Cited

U.S. PATENT DOCUMENTS

| 4,677,592 A | | 6/1987 | Sakurai et al. ............. 365/222 |
| 4,905,192 A | | 2/1990 | Nogami et al. |
| 4,984,208 A | | 1/1991 | Sawada et al. ............. 365/222 |
| 5,295,115 A | | 3/1994 | Furuya et al. ......... 365/230.06 |
| 5,394,373 A | | 2/1995 | Kawamoto ............. 365/230.06 |
| 5,619,470 A | * | 4/1997 | Fukumoto .................... 365/228 |
| 5,999,481 A | * | 12/1999 | Cowles et al. .............. 365/233 |
| 6,275,437 B1 | * | 8/2001 | Kim et al. .................. 365/222 |
| 6,366,509 B2 | * | 4/2002 | Shirley ....................... 365/200 |

FOREIGN PATENT DOCUMENTS

| DE | 3787187 T2 | 2/1994 |
| DE | 69219971 T2 | 12/1997 |
| DE | 69130210 T2 | 1/1999 |
| EP | 0 166 974 A2 | 5/1984 |
| EP | 0 237785 A2 | 2/1987 |

(Continued)

OTHER PUBLICATIONS

Abstract of Patent No. EP0511397 corresponding to KR9704746.

*Primary Examiner*—Richard Elms
*Assistant Examiner*—Hien Nguyen
(74) *Attorney, Agent, or Firm*—Choate, Hall & Stewart

(57) ABSTRACT

A semiconductor memory device capable of accelerating address access and shortening cycle time is provided. A first address decoder (2) and first refresh address decoder (5) respectively decode an external address (Xn) supplied from outside the semiconductor memory device and a refresh address (RXn) used for refreshing within the semiconductor memory device. A multiplexer (8) selects the external address side decode signal (XnDm) or the refresh address side decode signal (XnRm) and outputs the signal as a decode signal (XnMm) based on an external address transmission signal (EXTR) and refresh address transmission signal (RFTR) so that a refresh operation and a read/write operation is performed continuously within one memory cycle. A word driver (10) then decodes decode signals (XnMm, XpMq) selected with multiplexer (8) and so forth, and activates a word line (WLmq).

23 Claims, 17 Drawing Sheets

FOREIGN PATENT DOCUMENTS

| | | |
|---|---|---|
| EP | 0 511397 A1 | 11/1991 |
| EP | 0 533096 A2 | 9/1992 |
| JP | 58-26396 | 2/1983 |
| JP | 61-5495 | 1/1986 |
| JP | 62-188095 | 8/1987 |
| JP | 62-188096 | 8/1987 |
| JP | 5-74167 | 3/1993 |
| JP | 5-101650 | 4/1993 |
| JP | 6-28850 | 2/1994 |
| JP | 6-36557 | 2/1994 |
| JP | 7-176200 | 7/1995 |
| JP | 2937205 | 6/1999 |
| JP | 11-265579 | 9/1999 |
| JP | 2000-11681 | 1/2000 |
| KR | 97-4746 | 11/1990 |
| KR | 91-002029 | 3/1991 |
| KR | 91-2499 | 4/1991 |
| WO | WO 92/09084 | 5/1992 |

* cited by examiner

SEMICONDUCTOR MEMORY DEVICE

TECHNICAL FIELD

The present invention relates to a semiconductor memory device that uses DRAM (Dynamic Random Access Memory) cells that must be refreshed to retain data as memory cells, and more particularly, to an address access method that is suitable when operating a semiconductor memory device that uses DRAM cells in the form of general-purpose SRAM (static RAM) specifications (asynchronous specifications). In addition, the present invention relates to an address access method that is also applicable to a semiconductor memory device equipped with memory cells array that are accessed in the absence of a failure, and a spare memory cell array for remedying a failure by replacing a failed memory cell and so forth on that memory cell array.

BACKGROUND ART

Semiconductor memory devices have been proposed that detect the transition of an external address supplied from outside a semiconductor memory device, refresh the memory cells indicated by a refresh address generated within the semiconductor memory device, and following completion of refreshing, perform a read/write operation in accordance with the external address. As can be seen in Japanese Unexamined Patent Application, First Publication No. Sho 61-5495 and Japanese Unexamined Patent Application, First Publication No. Hei 6-36557, a method was employed for the address access method in this type of semiconductor memory device that decodes the switched address after switching the external address and refresh address.

The following provides an explanation of the address access method employed in the background art with reference to FIGS. 15 and 16. FIG. 15 is a block diagram showing the structure of a semiconductor memory device according to the background art, while FIG. 16 is a timing chart showing the operation of each section.

In block BLn shown in FIG. 15, refresh address generation section 213 generates refresh address RXn for refreshing memory cells in word line units. In addition, address buffer 211 and refresh address buffer 214 buffer external address Xn, which is a partial bit of the row address of the external address used for selecting a word line, and the above refresh address RXn, and output internal address Xn' and refresh address RXn', respectively.

Multiplexer 218 selects either internal address Xn' or refresh address RXn' based on an external address transmission signal EXTR and refresh address transmission signal RFTR generated by refresh control circuit 217, and then outputs address XnM. Blocks BLn+1 and BLn+2 have the same compositions as block BLn, and output address Xn+1M and Xn+2M, respectively. 1st address decoder 212 decodes these addresses and outputs decode signals X1Dm, X1Dm+1 and X1Dm+2. Block BLm is composed with the structural elements explained above, and is provided with block BLq and so forth that output decode signal X1D1q in the same manner.

Next, ATD (Address Transition Detector) 216 detects a change in the external address and outputs an address transition detection (hereinafter referred to as ATD) signal. Refresh control circuit 217 generates the above-mentioned external address transmission signal EXTR and refresh address transmission signal RFTR based on this address transition detection signal. Word driver 220 also serves as a decoder and performs decoding based on decode signals X1Dm and X1Dq to activate word line WLmq.

In this manner, in the semiconductor memory device of the background art, multiplexer 218, which performs switching of internal address Xn' obtained from external address Xn and refresh address RXn' obtained from refresh address RXn, is arranged between address buffer 211, refresh address buffer 214 and 1st address decoder 212.

The semiconductor memory device according to the above structure operates in the manner shown in FIG. 16. To begin with, a new access request is generated and external address changes from "A0" to "A1" at time t201. Whereupon, ATD216 detects this change and generates an ATD signal, and refresh control circuit 217 changes external address transmission signal EXTR and refresh address transmission signal RFTR for refreshing the memory cells corresponding to memory address "R0" to the low level (abbreviated as "L") and high level (abbreviated as "H"), respectively.

As a result, multiplexer 218 selects refresh address RXn', refresh address RXn' is output as address XnM at time t202 after a multiplexer delay due to the selection operation, and addresses Xn+1M and Xn+2M are output in the same manner. 1st address decoder 212 then decodes these addresses, outputs decode signals X1Dm, X1Dm+1 and X1Dm+2 at time t203 after a delay due to the decoding operation, and decode signal X1Dq is output from block BLq in the same manner. Subsequently, the word line corresponding to the external address is deactivated at time t204, and pre-charging of the bit line is performed until time t205. The above decode signals are decoded by word driver 220, and the refresh operation then begins with the activation of the word line corresponding to refresh address RXn' at time t205 after a delay for that operation.

Later at time t206, refresh control circuit 217 changes external address transmission signal EXTR and refresh address transmission signal RFTR for a read/write operation with respect to external address Xn to "H" and "L", respectively. As a result, multiplexer 218 selects internal address Xn on the external address side, and the address selected at time t207 after a delay for the operation of multiplexer 218 is output as address XnM. 1st address decoder 212 then performs decoding in the same manner as above, and a decode signal is output at time t208 after a delay for the decoding operation. Subsequently, at time t209, the word line corresponding to refresh address RXn' is deactivated, and pre-charging of the bit line is performed until time t210. Word driver 220 then decodes the decode signals output from blocks B1m and B1q, activates the word line corresponding to external address Xn at time t210 after delay for this operation, and then starts the read/write operation. The operation starting at time t211 then repeats the same operation as described above.

In this manner, in the address access method employed by the semiconductor memory device according to the background art, as shown in FIG. 16, the delay time from the time the internal operation of the semiconductor memory devices switches from refresh to the read/write operation (time t206) to the time the word line for the read/write operation is selected (time t210) is the sum of the respective delay times of ① the multiplexer delay required for the switching operation of multiplexer 218, ② the delay of the 1st address decoder, and ③ the delay of the word driver. Consequently, address access with respect to an external address (namely, until data DQ (A1) of the memory cells is obtained for the IO (input-output) output at time t212 from the time of switching from the refresh address to the external address at time t206) has the problem of being slow.

This applies similarly to when internal operation of the semiconductor memory device switches from read/write to refresh, and due to the delay in the timing by which the refresh operation is started, there is the problem of the completion of the refresh operation and the subsequent read/write operation being prolonged. In addition, although the above explanation provided a description of the case in which a read/write operation is performed after a refresh operation in which a change in the external address is used as a trigger, the same problems are encountered in the case in which a refresh operation is performed after a read/write operation using a change in the external address as a trigger.

Although this can also present a problem in the case of general-purpose DRAM as well, this is particularly a problem in terms of realizing a semiconductor memory device having general-purpose SRAM specifications that uses DRAM cells. Despite this, in general-purpose DRAM and so forth, since the refresh operation is not accompanied by a read/write operation and the read/write operation is not accompanied by a refresh operation, the above delay in address access does not present that much of a problem.

On the other hand, since the latter semiconductor memory device has general-purpose SRAM specifications, although the refresh operation cannot be recognized from outside the semiconductor memory device, it is necessary to perform the refresh operation regularly inside the semiconductor memory device. As one example for realizing this, the refresh operation using a change in the external address as a trigger and its following read/write operation may be performed according to time-sharing within a single memory cycle. In this structure, two operations in the form of a refresh operation and read/write operation are performed within a single memory cycle, and accompanying this, a decode operation and refresh address/external address selection operation are each performed twice.

In other words, in the case of comparing with general-purpose DRAM, in terms of simple calculations, twice the internal operations are performed in the latter semiconductor memory device, and this device is subject to even stricter conditions in terms of timing. In order to shorten the memory cycle and achieve faster operation in the semiconductor memory device, it is necessary to not only accelerate the refresh operation and read/write operation, but also reduce the time required for each operation other than these operations (e.g., decode operation).

In addition, the above problem may also arise for semiconductor memory devices equipped with spare memory cells. In recent years, measures for remedying failures have come to be commonly deployed in DRAM and other semiconductor memory devices for the purpose of remedying manufacturing defects present in memory cell arrays and improving yield. Namely, in this type of semiconductor memory devices, the memory cell array employs a redundant structure in which a spare memory cell array (to be referred to as a "spare cell array") for remedying failures by replacing a failed region in the inherently provided memory cell array (to be referred to as the "normal cell array") for reading or writing data is provided in addition to the normal cell array.

Although defects in the normal cell array may occur in individual memory cell units, there are many cases in which they occur linearly in "line" units such as word lines or bit line pairs. Consequently, in the remedying of failures of the normal cell array, the defective line or memory cell in the normal cell array is replaced with a line or memory cell of a spare cell array. This being the case, in the case there is an access request for a failed line or memory cell in the normal cell array, access is performed after switching to the line or memory cell in the spare cell array.

FIG. 17 is a block diagram showing the essential portion of the structure of a semiconductor memory device according to the background art. In this drawing, the structure of a semiconductor memory device represented by the DRAM and so forth described in Japanese Unexamined Patent Application, First Publication No. 2000-11681 is depicted in simplified form to facilitate understanding. In the drawing, memory cell array 250 is composed of a plurality of memory cells that require periodical refreshing in order to retain data. In addition, memory cell array 250 is composed of normal cell array 251 that is normally used for access, and spare cell array 252 for remedying failures.

Next, refresh counter 253 successively generates a refresh address REF_ADD for refreshing memory cell array 250. Multiplexer 254 selects either external address EXT_ADD or refresh address REF_ADD in accordance with a switching signal not shown, and outputs address MUX_ADD. Furthermore, as was previously described, external address EXT_ADD is an access address given from outside a semiconductor memory device accompanying a read or write request.

Next, program circuit 255 stores replacement information that indicates which line in spare cell array 252 replaces a failed line in normal cell array 251. In the case address MUX_ADD is given, program circuit 255 respectively generates a killer signal KL for suppressing selection of a line in normal cell array 251, and a redundancy selection signal RDN_ADD for selecting a line in spare cell array 252 that is used in the case of performing replacement.

Here, killer signal KL and redundancy selection signal RDN_ADD are both validated in the case a line in normal cell array 251 is replaced with a line in spare cell array 252. Consequently, decoder 256 does not generate a decode signal for selecting a line in normal cell array 251, and a normal side word driver not shown does not activate any line in normal cell array 251. Instead, a spare side word driver not shown activates a corresponding line in spare cell array 252 in accordance with redundancy selection signal RDN_ADD.

On the other hand, in the case a line in normal cell array 251 is not replaced with a line in spare cell array 252, both killer signal KL and redundancy selection signal RDN_ADD are invalidated. Consequently, decoder 256 generates a decode signal by decoding address MUX_ADD, and the normal side word driver activates a corresponding line in normal cell array 251 in accordance with this decode signal. At this time, the spare side word driver does not activate any line in spare cell array 252 since redundancy selection signal RDN_ADD has been invalidated.

As described above, in the semiconductor memory device according to the background art equipped with a spare memory cell, similar to that shown in FIG. 15, a decoder 256 is arranged at the latter stage of the multiplexer 254. The reason for the semiconductor memory device according to the background art employing this structure is to be able to share program circuit 255 and decoder 256 between the case in which memory cell array 250 is accessed with external address EXT_ADD and the case in which memory cell array 250 is refreshed with refresh address REF_ADD.

However, when such a structure is employed, in the case of accessing memory cell array 250 using, for example, external address EXT_ADD, the problem occurs in which access becomes slow and cycle time becomes longer for the same reasons as previously mentioned. Namely, in the structure of FIG. 17, after the value of external address EXT_ADD and its accompanying address MUX_ADD are defined, decoder 256 decodes address MUX_ADD and the normal side word driver activates memory cell array 250. In other words, the series of operations consisting of address definition, selection of external address or refresh address, decoding of the selected address and activation of the word line can all only be carried out in succession.

DISCLOSURE OF THE INVENTION

In consideration of the above background circumstances, the object of the present invention is to provide a semiconductor memory device that is able to accelerate address access and shorten cycle time by performing multiplexing after decoding an external address and refresh address. At this time, the object of the present invention is to reduce chip surface area by reducing the size of the circuit structure as much as possible.

In order to solve the above problems, the semiconductor memory device according to the present invention is a semiconductor memory device that performs a refresh operation and a read/write operation and that is provided with: a decoder that respectively outputs decode signals by decoding an access address for the read/write operation and a refresh address for the refresh operation; a first switching circuit that switches the decode signals; and a control circuit that performs the refresh operation or the read/write operation based on the switched decode signal.

In other words, in the present invention, after respectively decoding each signal of an access address supplied from the outside and a refresh address generated internally, a refresh operation or read/write operation is performed by switching the decode signals. In this manner, by arranging a decoder closer to the input side than the first switching circuit that switches the signal on the access address side and signal on the refresh address side, it is possible to perform the decode operation of the access address during the time until the decode signal is switched to the access address side accompanying the start of accessing. Consequently, in comparison with the semiconductor memory device of the background art, address access can be accelerated and cycle time can be shortened.

In addition, the present invention may be further provided with a memory cell array having a normal cell array and a spare cell array that replaces a failed region in the normal cell array, wherein the first switching circuit switches the decode signals according to a switching signal that specifies which of the refresh operation or the read/write operation is to be performed, and the control circuit accesses the normal cell array or the spare cell array in accordance with the switched decode signal in accordance with the presence or absence of a failure in a region in the normal cell array that is the target of the refresh operation or the read/write operation. In this manner, by accessing the normal cell array or spare cell array based on a switched decode signal corresponding to the presence or absence of a failure in a region in the normal cell array, an effect similar to the above is obtained even in a semiconductor memory device equipped with a spare cell array.

In addition, the present invention may be further provided with: a refresh address generation circuit that generates the refresh address corresponding to the normal cell array and the spare cell array that compose the memory cell array, a program circuit that generates a killer signal that prohibits selection of the normal cell array and a first selection signal that specifies the replacement region in the spare cell array for the access address in accordance with the need for replacement, and supplies the killer signal to the decoder, a selection signal generation circuit that generates a second selection signal that specifies a refresh region in the spare cell array based on the refresh address generated for the refresh operation of the spare cell array, and a second switching circuit that switches to either the first selection signal or the second selection signal in accordance with the switching signal; wherein when accessing the spare cell array, the control circuit accesses a replacement region or refresh region in the spare cell array that is specified by either the switched first selection signal or the switched second selection signal.

In other words, the entire memory cell array, including a failed region in the normal cell array and a region not used for replacement in the spare cell array, may be refreshed. As a result, it is no longer necessary to provide a program circuit for refreshing. Since the program circuit has a large number of fuses causing the circuit structure to become large, reducing the number of program circuits results in a smaller circuit structure, which is advantageous in terms of surface area. In addition, since a killer signal is supplied to the decoder, it is no longer necessary to provide a multiplexer and so forth for switching the killer signal. Thus, the circuit size becomes even smaller making it possible to reduce chip surface area.

In addition, the semiconductor memory device according to another aspect of the present invention is a semiconductor memory device that performs a refresh operation and a read/write operation and that is provided with: a selection circuit that selects either a refresh address for the refresh operation or an access address for the read/write operation, a decoder that decodes the selected refresh address or the access address and outputs decode signals, a first switching circuit that selects one of decode signals respectively generated for the refresh address and the access address prior to the refresh operation or the read/write operation when performing the refresh operation or the read/write operation, respectively, and a control circuit that performs the refresh operation or the read/write operation based on the selected decode signal.

In other words, in the present invention, decoding is performed by selecting either a refresh address or an access address, and the decode signal generated for each of these addresses prior to a refresh operation or read/write operation is selected when performing the refresh operation or read/write operation. As a result, not only the program circuit, but also the decoder can be shared in the refresh operation and read/write operation. Consequently, access can be accelerated and cycle time can be shorted in the same manner as previously described, while further reducing circuit size thereby making it possible to reduce chip surface area.

In addition, the present invention may be further provided with: a memory cell array having a normal cell array and a spare cell array that replaces a failed region in the normal cell array, wherein the control circuit accesses the normal cell array or the spare cell array in accordance with the selected decode signal corresponding to the presence or absence of a failure in a region in the normal cell array that is the target of the refresh operation or the read/write operation. As a result, since the normal cell array or spare cell array is accessed based on a decode signal selected according to the presence or absence of a failure in a region in the normal cell array, the same effects as previously described are obtained even in a semiconductor memory device equipped with a spare cell array.

In addition, the present invention may be further provided with an address transition detection circuit that detects a change in the access address or the validation of an activation signal as an address transition, wherein the control circuit performs the refresh operation and the read/write operation using the address transition as a trigger.

In other words, since the refresh operation and read/write operation are performed by using an address transition as a trigger, by for example, performing a read/write operation after performing a refresh operation, the decode operation and the operation of generating a killer signal and selection signal can be performed during the refresh period prior to the start of the read/write operation. Consequently, all of these signals can be defined at the time of switching from the refresh operation to the read/write operation, and the read/write operation can begin immediately, thereby making it possible to accelerate address access.

In addition, in the present invention, a word line may be selected based on a plurality of decode signals, and the positions of each of the switching circuits is determined for each route for obtaining the plurality of decode signals. In other words, the positions of a first switching circuit and a second switching circuit may be determined for each route to obtain these plurality of decode signals. Here, from the viewpoint of accelerating address access, the first switching circuit and second switching circuit are preferably arranged at locations as close to the memory cell as possible. On the other hand, when the first and second switching circuits are arranged at the latter stage, two systems for the structure extending to these switching circuits are needed, and the greater the increase in the number of these switching circuits accompanying an increase in the number of decode signals. Thus, by individually determining the arrangements of these switching circuits according to respective routes that generate decode signals, address access time, circuit size and chip surface area can be optimized for each semiconductor memory device.

In addition, in the present invention, the first switching circuit may select none of the decode signals over a prescribed period when the first switching circuit switches the decode signals. Alternatively, the second switching circuit may select none of the killer signals and the selection signals over a prescribed period when the second switching circuit switches the killer signals and the selection signals. In other words, a decode signal, killer signal and selection signal may be made to not be selected over a prescribed period when switching the decode signal, killer signal and selection signal. As a result, even if switching of the decode signals becomes faster accompanying increased speed of the semiconductor memory device, the possibility of a plurality of decode signals being simultaneously selected can be eliminated. The use of such a structure is particularly preferable in a semiconductor memory device that performs a refresh operation and read/write operation within the period of a single memory cycle since faster internal operation is required than general-purpose DRAM.

BEST MODE FOR CARRYING OUT THE INVENTION

Figure 1:
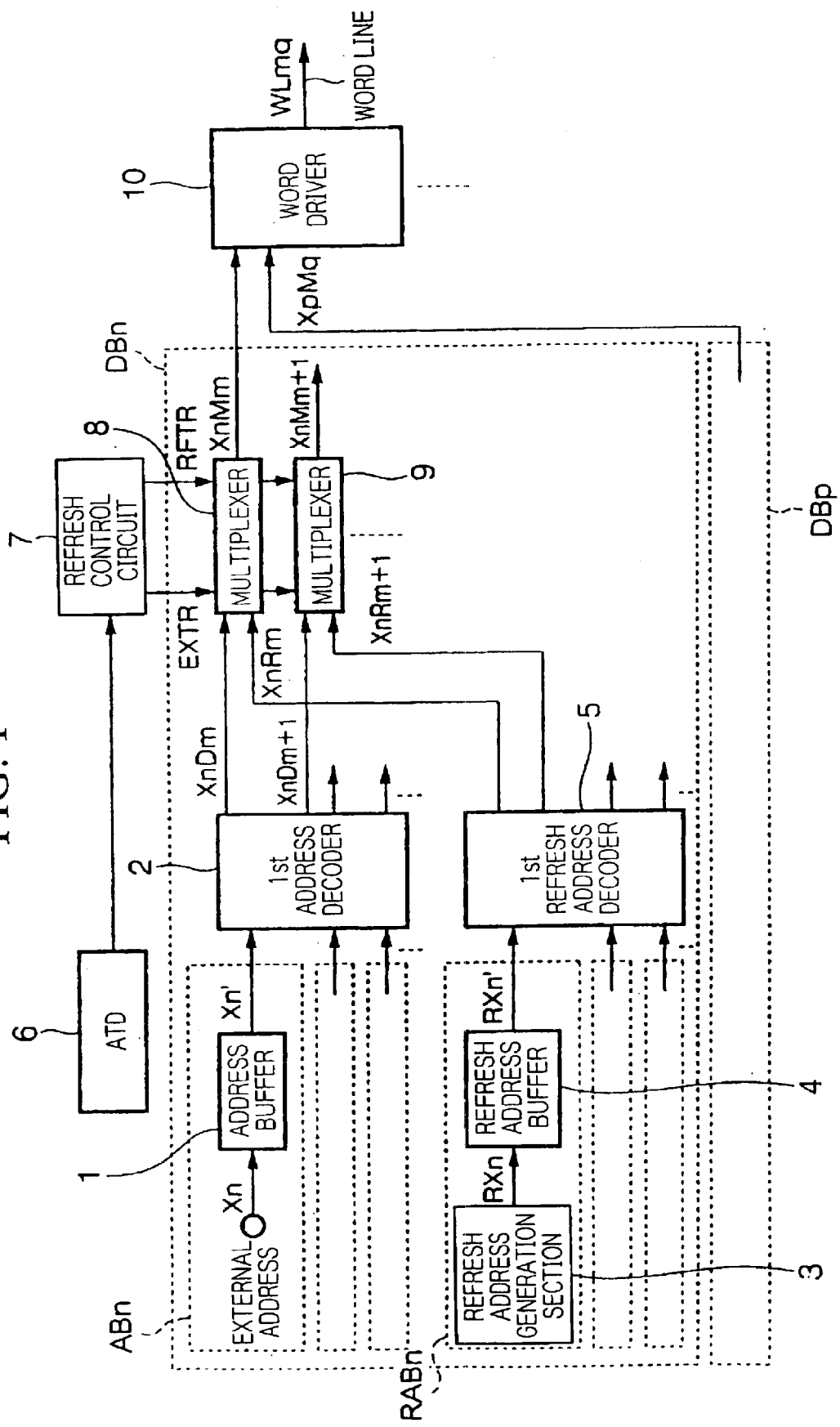
FIG. 1 is block diagram showing the structure of a semiconductor memory device for realizing an address access method according to a first embodiment of the present invention.

The following provides an explanation of each embodiment of the present invention with reference to the drawings. Here, not only can the present invention be applied to a general-purpose DRAM, but it can also be applied to an existing pseudo SRAM that operates with generally the same specifications as a general-purpose SRAM when viewed from the outside. However, the present invention is even more effective in the case of being applied to a completely SRAM-compatible semiconductor memory device previously proposed by the inventors of the present invention (Japanese Patent Application No. Hei 11-345345, to be referred to as the "related invention").

Therefore, in the present specification, an explanation is provided using the example of the semiconductor memory device according to the above-mentioned related invention. The semiconductor memory device according to the related invention operates with the same specifications as a general-purpose SRAM when viewed from the outside despite using the same memory cell as a general-purpose DRAM. Consequently, it is not necessary to operate by changing the chip enable signal at the time of each access as in the manner of existing pseudo SRAM, thereby resulting in low power consumption. In addition, together with the handling of this semiconductor memory device being simple in the same manner as SRAM, capacity can be increased without increasing the chip size in the same manner as DRAM. Thus, it has specifications that are suitable for next-generation cellular telephones and so forth that will appear in the future.

On the basis of this, in the present specification, a semiconductor memory device according to the related invention is referred to as a Mobile Specified RAM (MSRAM) or SRAM specifications DRAM. Although the detailed functions of the MSRAM will be described later, in an MSRAM, a read/write request is detected by detecting the change in an access address and chip select signal given from the outside. Refresh is then first performed using these changes as a trigger, and following this refresh operation, the read/write operation requested from the outside (to be referred to as a "normal access" or "Read/write operation" in order to distinguish from refresh) is performed.

In other words, as was previously described, in MSRAM, both refresh and normal access are performed continuously within a single memory cycle. This being the case, the period during which there is a skew in the access address and its value has yet to be determined can be allocated for the refresh operation. Moreover, since this period is equivalent to a standby period during which no internal operations are performed in general-purpose SRAM, standby period can be utilized effectively without delaying normal access.

Furthermore, since there are many refresh methods in which refresh is not performed in all memory cycles, but rather only performed intermittently, only normal access is performed in those memory cycles during which refresh is not performed. Incidentally, MSRAM are not only provided with a refresh function that performs refresh incidental to normal access in the same manner as general-purpose DRAM, but also provided with a self-refresh function that performs refresh automatically by generating a refresh address within the MSRAM.

In addition, the chip select signal is a signal that determines selection or non-selection of the semiconductor memory device. In particular, this is an activating signal that is used to select the desired chip in systems composed of a plurality of chips. Although a chip select signal is used as an activating signal in the following explanation, it is not limited to this, but rather may be any signal provided it has an equivalent function. However, there are some chip enable signals, which are one type of this signal, that have an address latch timing control function, and existing pseudo SRAM have the problem of increased power consumption due to input of a chip enable signal for controlling the timing of address latch for each cycle. In view of the above, a signal that has a chip activating function, but does not have an address latch timing control function, is used for the activating signal in the present invention.

[First Embodiment]

Figure 2:
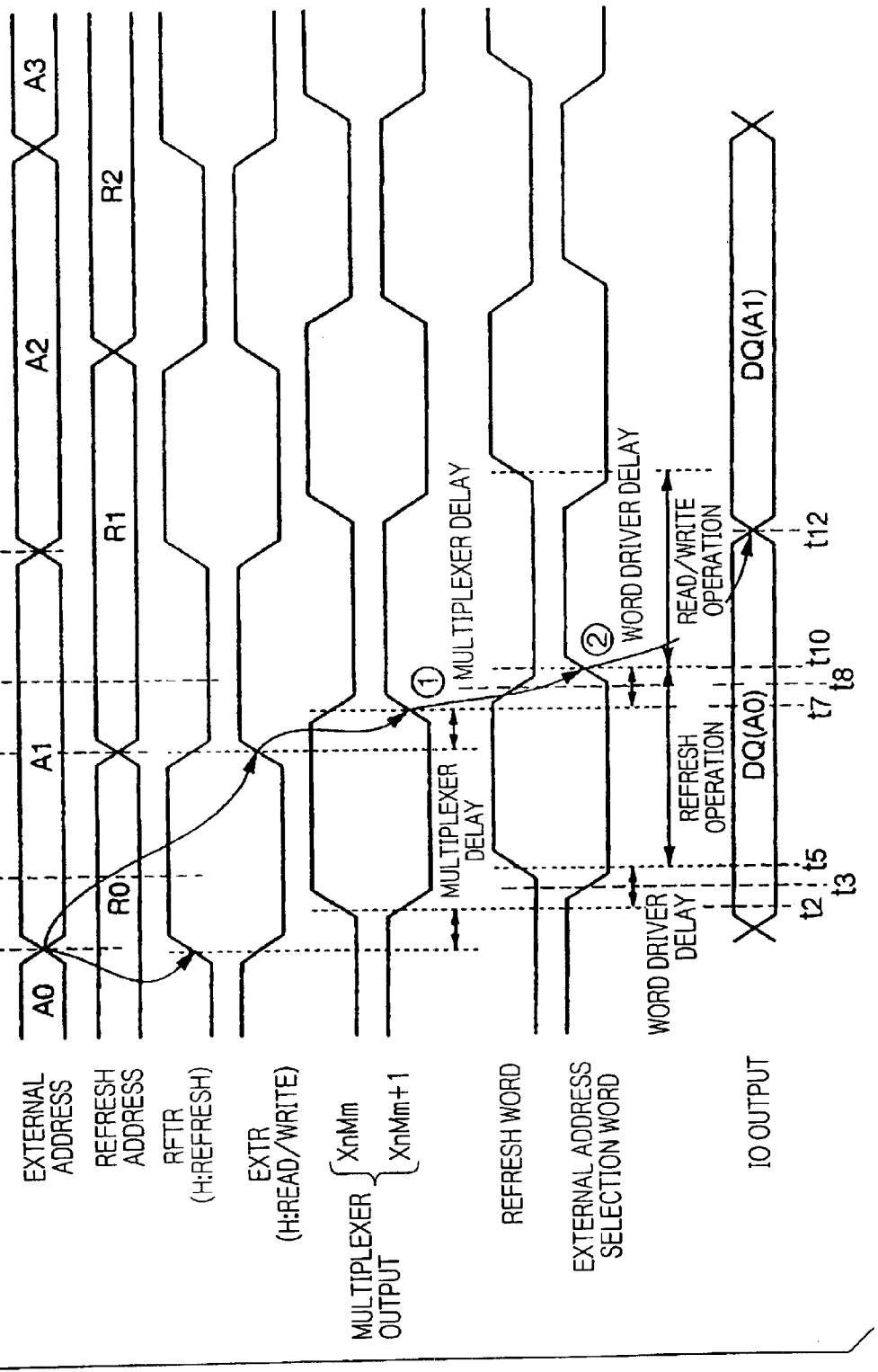
FIG. 2 is a timing chart showing the operation of the semiconductor memory device shown in FIG. 1.

FIG. 1 is a block drawing showing the structure of a semiconductor memory device according to the present embodiment, while FIG. 2 is a timing chart showing the operation of each section in the semiconductor memory device shown in FIG. 1. In block ABn of FIG. 1, external address Xn is a single bit of the row address that is used to select a word line among the addresses supplied from outside the semiconductor memory device.

Here, as was previously described, in addition to being able to be applied to a general-purpose DRAM, the present invention can also be applied to a pseudo SRAM or MSRAM. Among these, since the latter two semiconductor memory devices have SRAM-compatible specifications, the concept of a row address and column address does not exist for the access address given from outside the semiconductor memory device. Thus, in the case of applying to these, within the semiconductor memory device of the present invention, an address supplied from the outside is logically divided into a row address and column address.

Next, address buffer 1 outputs internal address Xn' by buffering external address Xn. The prescribed number of blocks composed in the same manner as block ABn are provided. Next, 1st address decoder 2 decodes internal address Xn' and so forth output from block ABn and outputs, for example, decode signals XnDm and XnDm+1, and is arranged between address buffer 1 and multiplexers 8 and 9. Furthermore, in the present embodiment, the case of two stages of decoders are shown as a structure for selecting a word line, with 1st address decoder 2 serving as the initial decoder, and the decoder within word driver 10 to be described later serving as the final decoder.

Next, in block RABn, refresh address RXn is a single bit of a refresh address used for refreshing memory cells (not shown) in a single or plurality of word line units. Refresh address generation section 3 contains a built-in counter circuit, and together with generating that count value in the form of refresh address RXn, it increases the count of the counter circuit in accordance with a clock signal supplied from refresh control circuit 7 (to be described later). This counter circuit is a single-bit counter corresponding to refresh address RXn, and a refresh counter is composed by providing this counter circuit for the number of bits of the refresh address. For example, if the refresh address Rxn shown in FIG. 1 is assumed to be the least significant bit of the refresh address, the output of the counter circuit within refresh address generation section 3 is input in the form of a carry up signal to the counter circuit of the next stage (not shown) corresponding to the bit one bit higher than the least significant bit. Similarly, the output of the counter circuit of each stage is supplied in the form of a carry up signal to the counter circuit of the next stage until the counter circuit corresponding to the most significant bit is reached. Furthermore, the refresh counter may be any counter provided it sequentially outputs the refresh address within a range of, for example, 0-4095 (decimal). Consequently, after the power has been turned on, the refresh counter should count successively starting from the count value retained in the refresh counter at that time, and it is not necessary to initialize the refresh counter when the power is turned on.

Refresh address buffer 4 outputs refresh address PXn' by buffering refresh address RXn. A prescribed number of blocks having a similar structure to block RABn are also provided. 1st refresh address decoder 5 is composed in the same manner as 1st address decoder 2, outputs, for example, decode signals XnRm and XnRm+1 by decoding refresh address RXn' and so forth output from block RABn, and is arranged between refresh address buffer 4 and multiplexers 8 and 9.

Multiplexer 8 selects either the external address side decode signal or refresh address side decode signal corresponding to external address transmission signal EXTR and refresh address transmission signal RFTR output from refresh control circuit 7 (to be described later). Namely, if external address transmission signal EXTR is "H", multiplexer 8 selects decode signal XnDm and outputs it in the form of decode signal XnMm. On the other hand, if refresh address transmission signal RFTR is "H", multiplexer 8 selects decode signal XnRm and outputs it in the form of decode signal XnMm. Furthermore, external address transmission signal EXTR and refresh address transmission signal RFTR are never simultaneously "H".

Multiplexer 9 is composed in the same manner as multiplexer 8, selects either decode signal XnDm+1 or XnRm+1 corresponding to external address transmission signal EXTR and refresh address transmission signal RFTR, and outputs in the form of decode signal XnMm+1. Block DBn is composed according to the constituent elements described above, and a prescribed number of similar blocks are provided. Block DBp is shown in FIG. 1 as one example of this. Furthermore, in order to simplify the explanation, although blocks DBn and DBp are assumed to have the same structure in FIG. 1, a structure may also be employed in which the number of stages of decoders differs for each block as is described later.

Next, ATD 6 outputs an ATD signal to refresh control circuit 7 by detecting a change in the external address. Refresh control circuit 7 generates external address transmission signal EXTR and refresh address transmission signal RFTR and outputs them to multiplexers 8 and 9 based on this ATD signal. In addition, refresh address control circuit 7 generates a clock signal and supplies that signal to refresh generation section 3 each time one refresh operation is completed, and as a result, controls refresh address generation section 3 so that it updates the refresh address for the next refresh operation. Word driver 10 also functions as the final stage decoder as previously mentioned, and decodes decode signal XnMm and decode signal XpMq, which is obtained by the decode operation in block DBp, to activate word line WLmq. Furthermore, word drivers composed in the same manner as word driver 10 are also provided for each word line in addition to word line WLmq.

As has been described above, the present embodiment is characterized by arranging the locations of multiplexers 8 and 9 between 1st address decoder 2, 1st refresh address decoder 5 and word driver 10, and is composed so that multiplexers 8 and 9 are controlled by external address selection signal EXTR and refresh address selection signal RFTR that are generated in refresh control circuit 7.

Furthermore, specific examples of the structures of the essential portions within the semiconductor memory device (address buffer, refresh address buffer, 1st address decoder and multiplexers) are described later with reference to FIGS. 3 through 5.

Next, an explanation is provided of the operation of a semiconductor memory device according to the above structure with reference to FIG. 2.

To begin with, the refresh address is assumed to be "R0" and the external address is assumed to be "A0" prior to time t1. Refresh address value "R0" is decoded with 1st refresh address decoder 5 by way of refresh address buffer 4, and the resulting decode signals XnRm and XnRm+1 are respectively input to multiplexers 8 and 9. Furthermore, this applies similarly to external address value "A0" (or more precisely, the row address portion of the external address, and this is to apply similarly hereinafter) in that this external address value is decoded with 1st address decoder 2 by way of address buffer 1, and decode signals XnDm and XnDm+1 obtained by the decode operation are respectively input to multiplexers 8 and 9. These operations are performed by time t1.

Next, when a new access request is generated for the semiconductor memory device, and the value of the external address changes to "A1" at time t1, a refresh operation and its subsequent normal access are performed using this change as a trigger. Namely, ATD 6 generates an ATD signal by detecting this change in the external address, and outputs that signal to refresh control circuit 7. Refresh control circuit 7 then causes external address transmission signal EXTR and refresh address transmission signal RFTR to change to "L" and "H", respectively, in order to refresh the memory cell connected to the word line corresponding to refresh address value "R0".

As a result, multiplexer 8 selects decode signal XnRm, and decode signal XnMm is output at time t2 following the passage of a multiplexer delay due to the selection operation. Multiplexer 9 performs a similar operation to multiplexer 8, and outputs decode signal XnRm+1 in the form of decode signal XnMm+1 at time t2. In addition, an operation similar to that of block DBn is performed in block DBp, and for example, decode signal XpMq is output. Word driver 10 then performs decoding based on these two decode signals. Subsequently, at time t3, the word line corresponding to the external address is deactivated, and precharging of the bit line is performed by time t5. If the word line corresponding to refresh address "R0" is assumed to be word line WLmq, word driver 10 begins the refresh operation by activating word line WLmq at time t5 following the passage of an operational delay caused by itself.

The following operation is then performed in parallel with the above operation. Namely, when the value of the external address changes at time t1, the row address portion of its value "A1" is input to 1st address decoder 2 via address buffer 1. 1st address decoder 2 then decodes this value and respectively outputs decode signals XnDm and XnDm+1, which are the result of decoding, to multiplexers 8 and 9 at time t4. Furthermore, these operations should be performed by time t6 when multiplexers 8 and 9 perform switching from the refresh side to the external address side.

At the following time t6, refresh control circuit 7 causes external address transmission signal EXTR and refresh address transmission signal RFTR to change to "H" and "L", respectively, in order to normally access the external address for which the value has changed at time t1. Here, the levels of decode signals XnDm and XnDm+1 corresponding to value "A1" of the external address are defined by time t6 as previously mentioned. Multiplexers 8 and 9 select these decode signals and output decode signals XnMm and XnMm+1, respectively, at time t7 following the passage of the multiplexer operational delay. In addition, a similar operation is performed in block DBp resulting in output of decode signal XpMq. Subsequently, the word line corresponding to the refresh address is deactivated at time t8, and pre-charging of the bit line is performed by time t10.

Word driver 10 performs decoding based on the above decode signals and begins normal access by activating the word line corresponding to the row address portion of external address value "A1" at time t10 following the passage of the word driver operational delay. As a result, if an access request from the outside is a read request, data "DQ(A1)" of the memory cell specified by external address value "A1" is read and output to the IO output at time t12.

In addition, the following operation is performed in parallel with the above operation. Namely, when time t6 is reached, refresh generation section 3 increases the count of the internal refresh counter according to a clock signal supplied from refresh control circuit 7. As a result, refresh address value "R0" is updated to "R1" (such that if R0 is "1", for example, R1 becomes "2"). This value is input to 1st refresh address decoder 5 by way of refresh address buffer 4. 1st refresh address buffer 5 then decodes this value "R1", and outputs the results of decoding in the form of decode signals XnRm and XnRm+1 to multiplexers 8 and 9, respectively, at time t9. These decode signals are used for the next refresh operation. In the example of FIG. 2, these decode signals are used for the refresh operation that starts by using the change of the external address value to "A2" at time t11 as a trigger. Furthermore, these operations should be performed by time t11 when multiplexers 8 and 9 perform switching from the external address side to the refresh side.

The operation starting at time t11 then repeats an operation similar to that from time t1 to time t11 described above.

Figure 16:
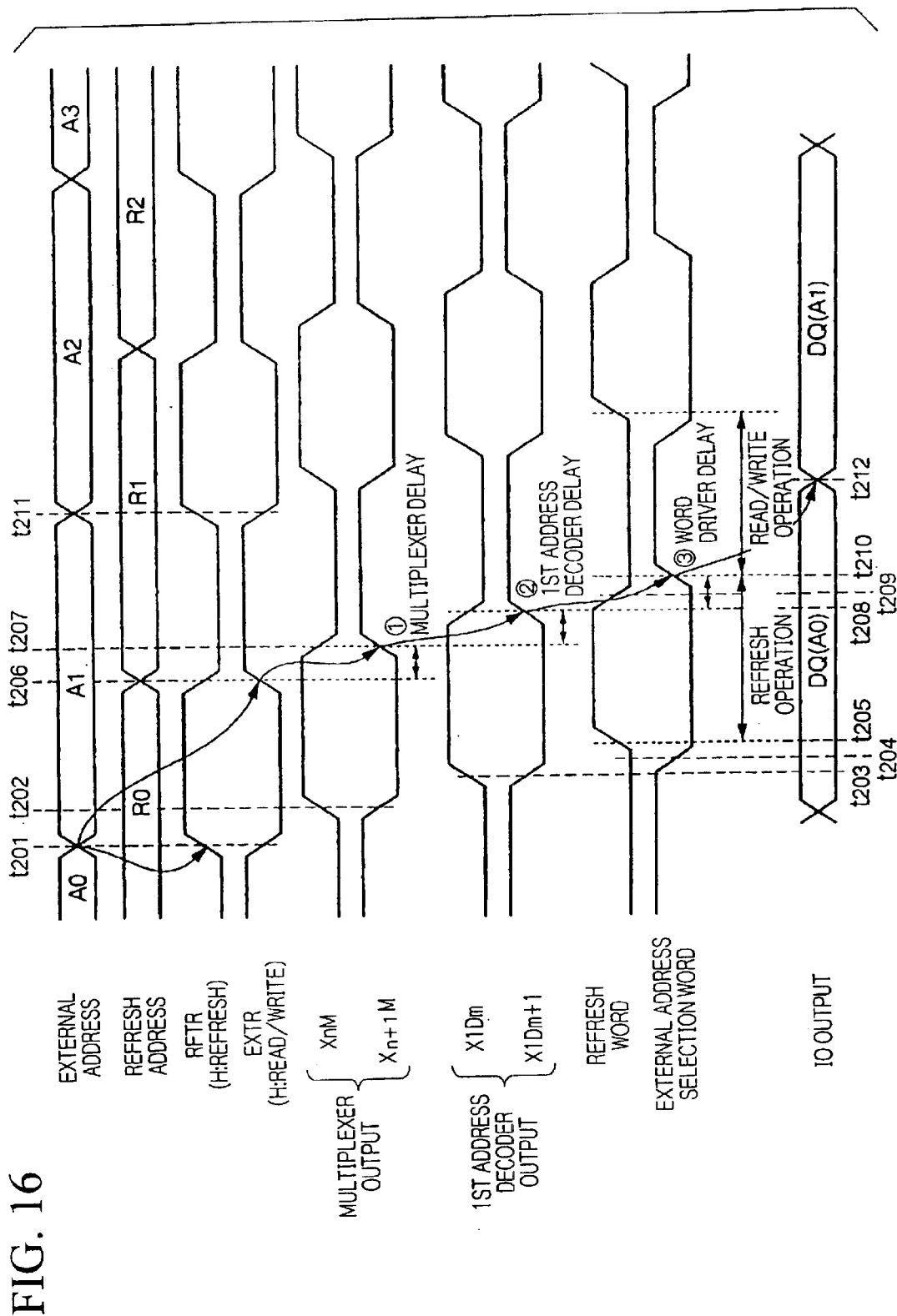
FIG. 16 is a timing chart showing the operation of the semiconductor memory device shown in FIG. 15.

In this manner, in the present embodiment, as shown in FIG. 1, after decoding of an external address and refresh address is performed by a 1st address decoder 2 and 1st refresh address decoder 5, switching of the decode signals output from these decoders is performed in multiplexers 8 and 9. Consequently, the time until a word line is selected when internal operation has changed from the refresh operation to normal access is the sum of multiplexer delay ①, which is the time for switching by multiplexers 8 and 9, and word driver delay ②, due to word driver 10, as shown in FIG. 2. This time is not affected by the operational delay of the 1st address decoder 2 or 1st refresh address decoder 5 (see FIG. 16) as in the background art. This is the result of the refresh operation performed prior to normal access, and the decode operation for the normal access, being performed in parallel prior to the normal access, thereby making it possible accelerate operation by an amount corresponding to the above decode operation.

Figure 3A:
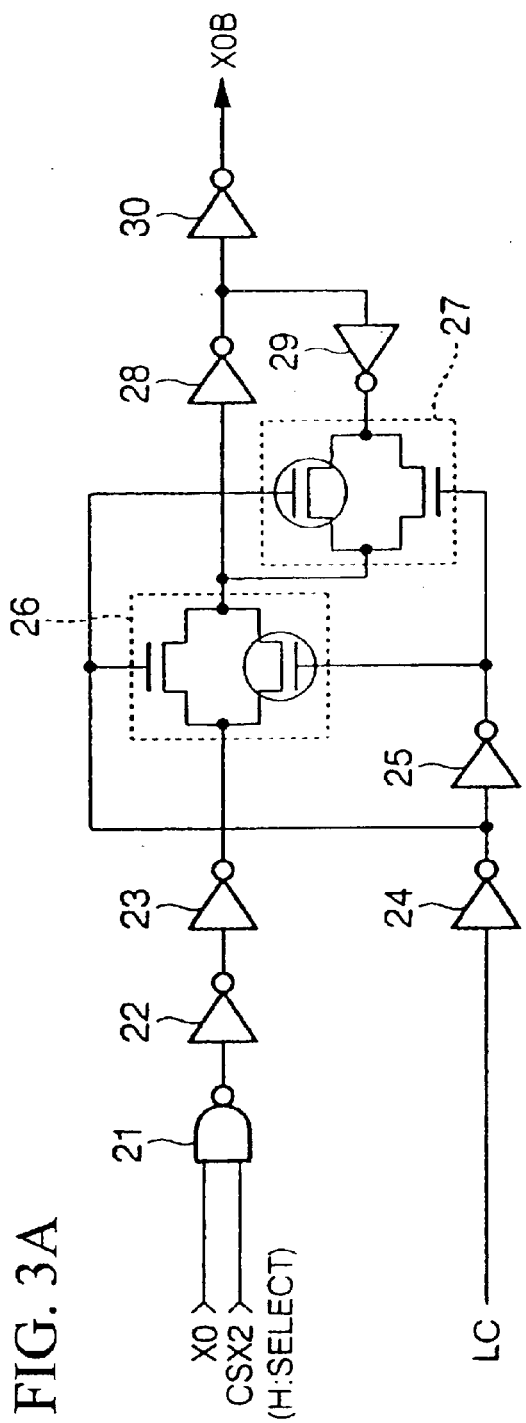
FIG. 3A is a circuit diagram of the address buffer shown in FIG. 1.

Here, a circuit diagram of address buffer 1 is shown in FIG. 3A. In this drawing, NAND 21 outputs external address X0, which is the 0 bit of the external address, through inverters 22 and 23 when chip select signal CSX2 is "H" and the semiconductor memory device is activated. Furthermore, when chip select signal CSX2 is "L", NAND 21 fixes the output at "H" to reduce power. Inverters 24 and 25 buffer latch control signal LC (the details of which are omitted since it is not directly related to the present invention).

Transfer switches 26 and 27 are composed of complementary polarity transistors. Inverters 28 and 29 compose a latch for holding the external address during normal access. When latch control signal LC is "L", transfer switches 26 and 27 are on and off, respectively, and the output of inverter 23 is output directly as address X0B (referring to the inverted signal of address X0, and equivalent to internal Xn' of FIG. 1) through inverters 28 and 30. On the other hand, when latch control signal LC is "H", transistor switches 26 and 27 are off and on, respectively, and the output of inverter 23 is incorporated in the latch.

Figure 3B:
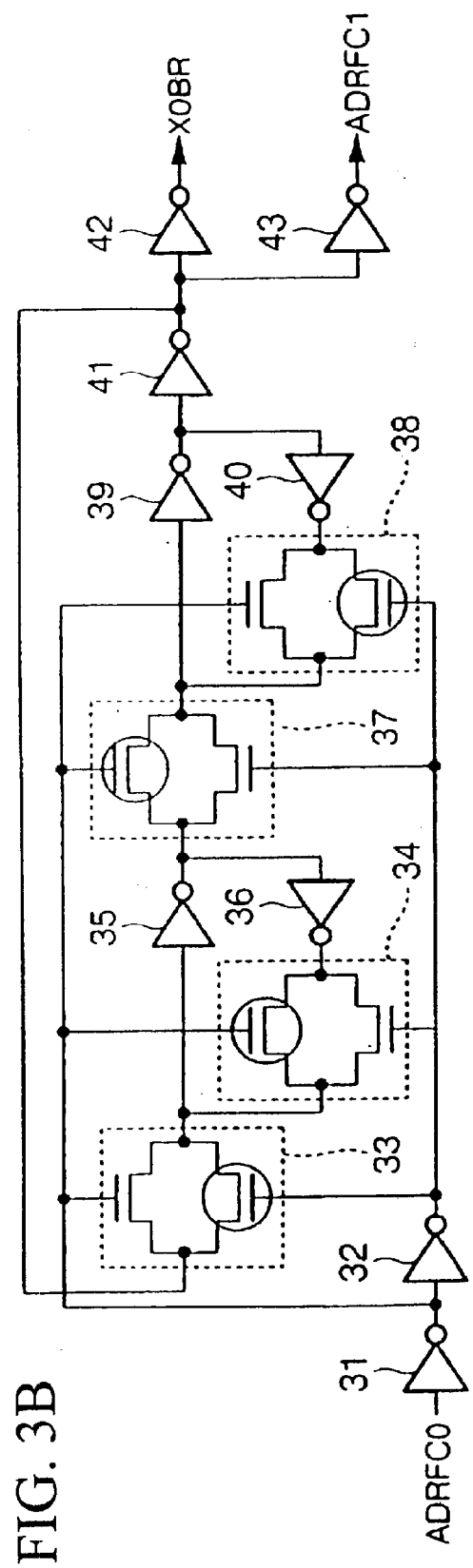
FIG. 3B is a circuit diagram of the refresh address generating section and refresh address buffer shown in FIG. 1.

Next, a circuit diagram of refresh address generation section 3 and refresh address buffer 4 is shown in FIG. 3B. This drawing shows the structure of the counter circuit for 1 bit of the refresh counter with respect to the least significant bit of the refresh address. As described above, the counter circuit shown in FIG. 3B is provided in the same number as the number of bits of the refresh counter. Here, clock ADRFC0 is a clock signal that is supplied from refresh control circuit 7 (FIG. 1) for increasing the count of the counter circuit shown in the drawing. In addition, carry up signal ADRFC1 that is output from the counter circuit is supplied as the input of the counter circuit of the 1st bit arranged in the stage following the counter circuit shown in the drawing (and is equivalent to clock signal ADRFC0 of FIG. 3B). Similarly, carry up signals ADRFC2, ADRFC3, . . . and ADRFCn (where n is the number of bits of the refresh counter–1), which are not shown in the drawing, are input to the counter circuits of the 2nd, 3rd, . . . and nth bits, respectively.

Inverters 31, 32, 35 and 36 as well as transfer switches 33 and 34 are composed in the same manner as inverters 24, 25, 28 and 29 as well as transfer switches 26 and 27 shown in FIG. 3A, and compose the latch of the previous stage. In addition, transfer switches 37 and 38 as well as inverters 39 and 40 are composed in the same manner as the latch of the previous stage, with the exception of the on/off control of the transfer switches being the opposite, and compose the latch of the latter stage.

According to this structure, the data of the previous latch is transferred to the latch of the latter stage in synchronization with the rising edge of clock ADRFC0, and the data of the latch of the latter stage is transferred to the previous latch after being inverted in inverter 41 in synchronization with the falling edge of clock ADRFC0. Consequently, carry up signal ADRFC1 realizes a counting operation equivalent to 1 bit by switching between "0" and "1" at twice the period of clock ADRFC0. Furthermore, the data of the latch of the latter stage is output as address X0BR (equivalent to refresh address RXn' of FIG. 1), which is the 0 bit of refresh address RXn' (FIG. 1), through inverters 41 through 43.

Figure 4:
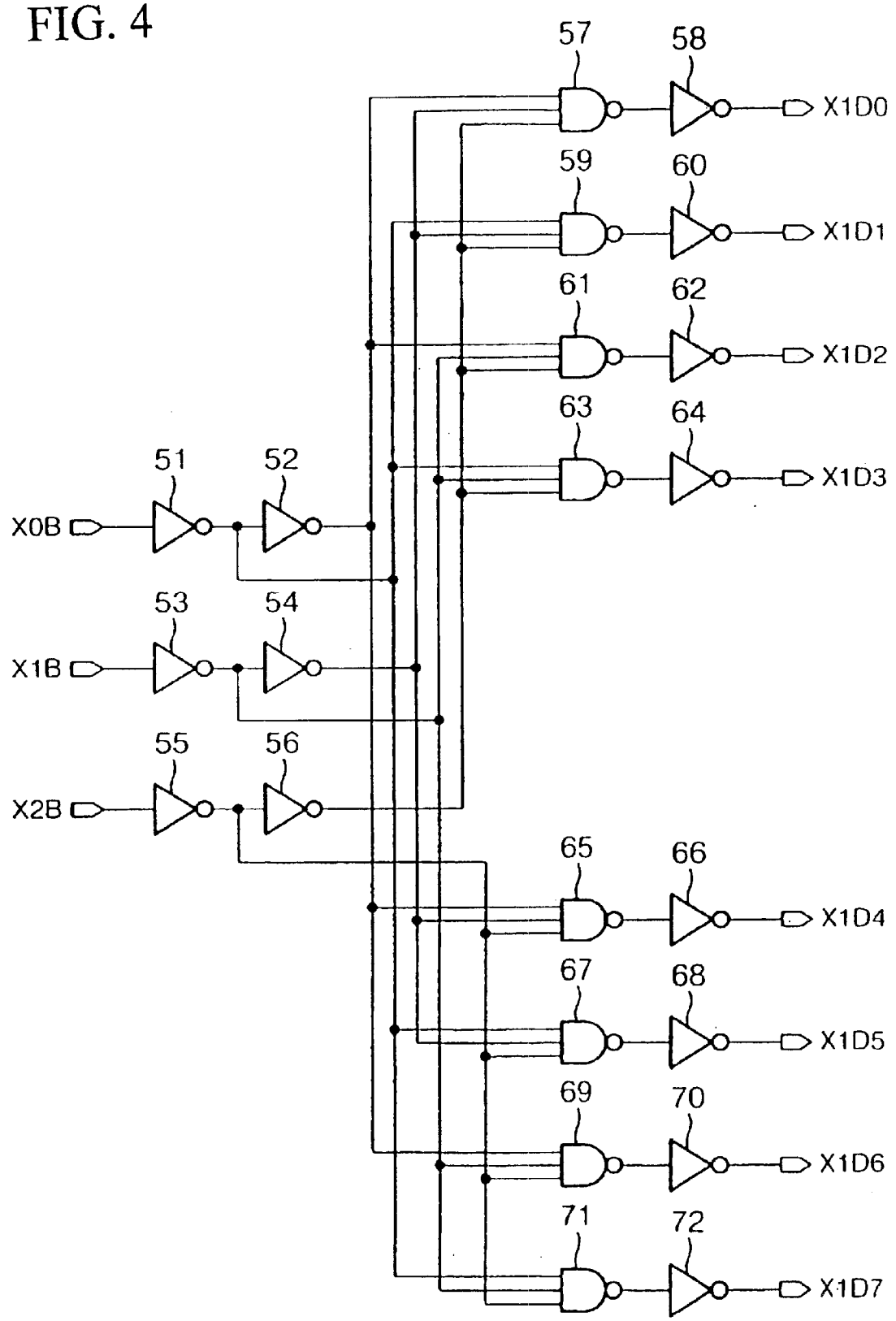
FIG. 4 is a circuit diagram of the address decoder or refresh address decoder shown in FIG. 1.

Next, a circuit diagram of 1st address decoder 2 is shown in FIG. 4. Although this drawing depicts an ordinary 3–8 decoder, an explanation is provided for the sake of confirmation. Addresses X0B through X2B, which are inverted signals of the lower 3 bits of the internal address (equivalent to internal address Xn' of FIG. 1), are converted to addresses X0 through X2 (not shown) with inverters 51, 53 and 55. Next, complementary signals of these addresses are generated with inverters 52, 54 and 56, and decode signals X1D0 through X1D7 (equivalent to decode signals XnDm and XnDm+1 of FIG. 1) are output by performing actual decoding operations with NAND 57, . . . , and 71 and inverters 58, . . . , and 72. Furthermore, 1st refresh address decoder 5 has a circuit structure that is similar to 1st address decoder 2 shown in FIG. 4.

Figure 5:
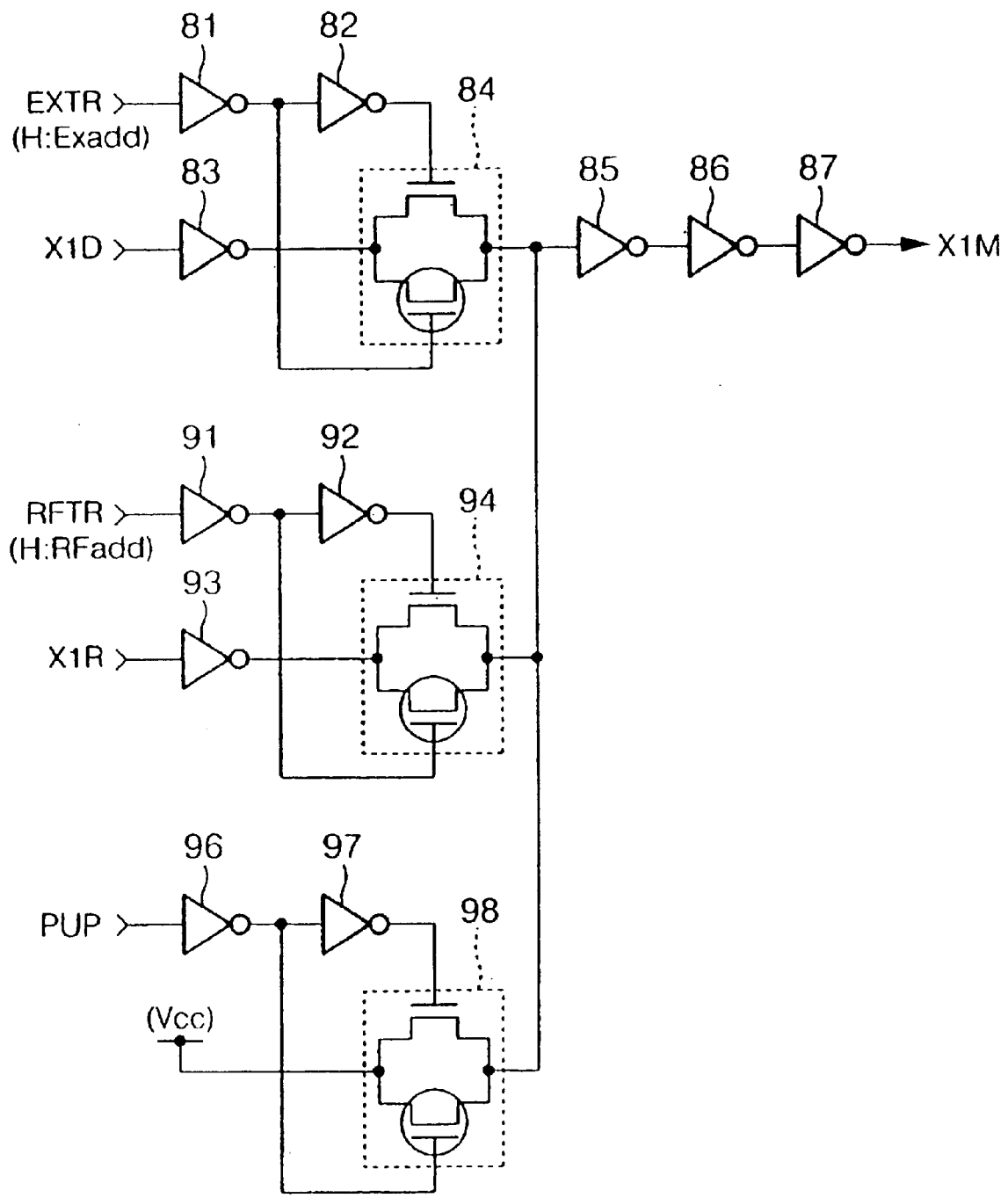
FIG. 5 is a circuit diagram of the multiplexer shown in FIG. 1.

Next, although a circuit diagram of multiplexer 8 is shown in FIG. 5, multiplexer 9 is composed in the same manner. This drawing shows the circuit structure for the address of 1 bit, and is composed of two selection circuits and one potential fixing circuit. In the first selection circuit, when external address transmission signal EXTR is "H", transfer switch 84 is switched on by inverters 81 and 82. Consequently, decode signal X1D of the external address side (equivalent to decode signal XnDm and so forth of FIG. 1) is output as decode signal X1M (equivalent to decode signal XnMm of FIG. 1) through inverter 83, transfer switch 84 and inverters 85 through 87.

Similarly, in the second selection circuit, when refresh address transmission signal RFTR is "H", transfer switch 94 is switched on by inverters 91 and 92. Consequently, decode signal X1R on the refresh address side (equivalent to XnRm and so forth of FIG. 1) is output as decode signal X1M through inverter 93, transfer switch 94 and inverters 85 through 87.

Here, external address transmission signal EXTR and refresh address transmission signal RFTR are controlled so as not to be "H" simultaneously. However, if composed to be provided with only first and second selection circuits, there is the possibility of both transmission signals simultaneously being "H" accompanying the rise/fall of these transmission signals. In order to eliminate this possibility, in the present embodiment, a period is provided during which both external address transmission signal EXTR and refresh address transmission signal RFTR are "L" when switching between the refresh operation and normal operation. At that time, however, decode signal X1M fixed at "L" with the potential fixing circuit is output to put all decode signals in the non-selected state so as to prevent floating by decode signal X1M.

Namely, in the case both external address transmission signal EXTR or refresh address transmission signal RFTR are "L", and neither decode signal X1D or X1R is selected, potential fixing signal PUP that is input to inverter 96 becomes "H". Consequently, transfer switch 98 is switched on by inverters 96 and 97, and power supply voltage Vcc connected to its input is supplied to inverter 85 causing decode signal X1M to be fixed at "L".

In a semiconductor memory device like an MSRAM that performs refreshing and normal access on a time-sharing basis within a single memory cycle, it is particularly preferable to employ a constitution like that described above for the constitution of the multiplexers. This is because, in this type of semiconductor memory device, internal operation becomes faster in comparison with a general-purpose DRAM and so forth, and the accompanying switching speed in the multiplexers is also accelerated. Thus, in the case of a multiplexer composed only of first and second selection circuits, the rise/fall times of external address transmission signal EXTR and refresh address transmission signal RFTR are actualized, thereby increasing the possibility of both signals simultaneously being "H".

Furthermore, in the present embodiment, two stages of decoders are shown in order to simplify the explanation. However, the number of decoder stages is not limited to two, but rather the number of decoder stages may be any arbitrary number, and is suitably decided according to the structure and required specifications of the semiconductor memory device. For example, a structure may be employed wherein, instead of word driver 10 being provided with a decoder function, it may have the function of a multiplexer.

In addition, the location of the multiplexer should also be suitably decided according to the structure and required specifications of the semiconductor memory device. For example, in the case of composing using three stages of decoders, examples of possible structures include that in which a multiplexer is arranged between the first stage and second stage decoders and the word line is selected with a word driver of the final stage, or a structure in which a multiplexer is arranged between the second and third stage decoders and the word line is selected with a word driver of the final stage.

Here, the optimum arrangement of the multiplexer is preferably determined for each product based on performance, cost and so forth of the semiconductor memory device while taking into consideration the following points. Namely, according to the structure shown in FIG. 1, the refresh operation or normal access operation starts by using decode signals output from multiplexers 8 and 9 as the starting point. Thus, arranging the multiplexers at a location as close to the memory cell as possible serves to accelerate address access.

However, the number of decode signals increases as the decoder is arranged at the latter stage, and a two-route circuit configuration for the external address and refresh address (1st decoder in FIG. 1) is required in the pathway leading to the multiplexers. Consequently, the closer the multiplexers are arranged to the memory cell, the greater the increase in the number of multiplexers in proportion to the increase in the number of decode signals, and in addition to an increase in the number of decoders arranged farther to the front than the multiplexers, since there is also an increase in the number of signal lines, this leads to an increase in both circuit size and occupied surface area.

In addition, in the case there is a plurality of routes of decode signals input to word driver 10, it is not necessary to arrange multiplexers in all routes at the latter stage of the decoders. Namely, although it is necessary to arrange the multiplexers at the latter stage of the decoders to emphasize performance with respect to the critical path that is the rate-limiting factor of address access, with respect to high-speed paths in which the number of stages of decoders is small in comparison with the critical path, the multiplexers may be arranged, for example, in a stage before the first stage decoder in order to reduce circuit size and occupied surface area. In other words, in this case as well, the optimum arrangement of multiplexers is individually determined for each route of decode signals while taking into consideration the structure and required specifications of the semiconductor memory device.

In addition, the explanation of the present embodiment used the example of the case of refresh being performed continuously with consecutive memory cycles by using the change in the external address as a trigger as shown in FIG. 2. However, the present invention is not limited to this type of refresh, but rather can also be applied to a form in which refresh is performed at prescribed time intervals determined with a refresh timer, and this applies similarly to other embodiments explained to follow.

[Second Embodiment]

Figure 6:
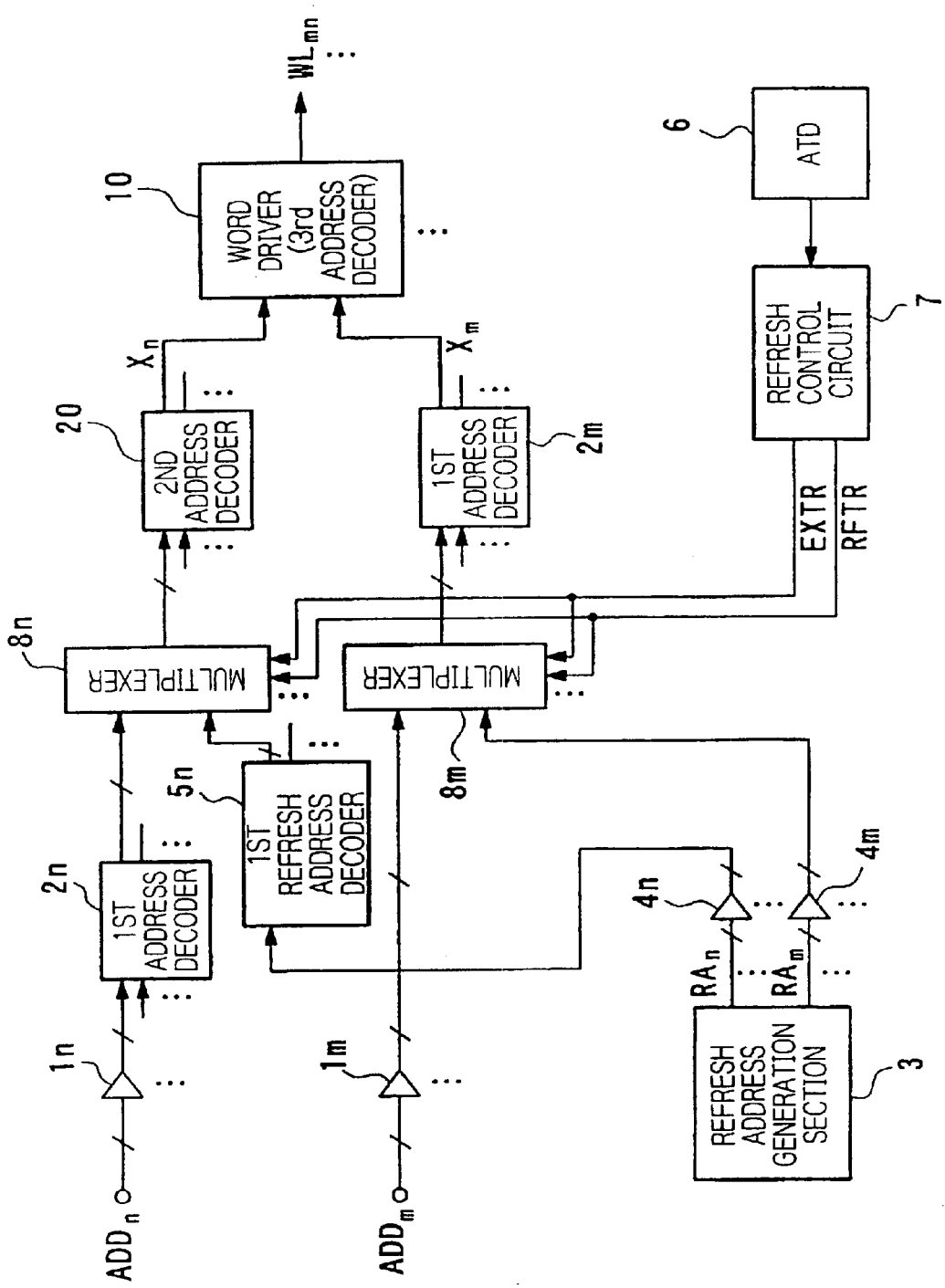
FIG. 6 is a block diagram showing the structure of a semiconductor memory device according to a second embodiment of the present invention.

In the present embodiment, a specific example is explained of the case of applying the present invention to a form in which the number of decoder stages varies according to the decode signal route. FIG. 6 is a block drawing showing the structure of a semiconductor memory device according to the present embodiment, and the same reference symbols are used for those constituent elements that are the same as FIG. 1.

In the drawing, external addresses ADDm and ADDn are partial bits of the row address included in the external address. In addition, refresh address generation section 3 outputs refresh addresses RAm and RAn so as to correspond to these external addresses. With respect to the decode signal Xn side, address buffer 1*n*, refresh address buffer 4*n*, 1st address decoder 2*n* and 1st refresh address decoder 5*n* are provided in the same manner as FIG. 1. One of the decode signals generated by both these decoders is selected by multiplexer 8*n* having the same structure as multiplexer 8 of FIG. 1, and the selected decode signal is further decoded with 2nd address decoder 20 resulting in output of decode signal Xn.

On the other hand, with respect to the decode signal Xm side, external address ADDm and refresh address RAm are respectively input to multiplexer 8*m* via address buffer 1*m* and refresh address buffer 4*m*, after which one of these is selected. The selected address is input to 1st address decoder 2*m* resulting in output of decode signal Xm. Decode signals Xm and Xn generated in the above manner are then further decoded by word driver 10, and then activated if word line WLmn is selected.

In this manner, in the present embodiment, there are two stages of decoders, including word driver 10, with respect to external address ADDm, and there are three stages of decoders, including word driver 10, with respect to external address ADDn (the "3rd address decoder" in the drawing refers to the case of focusing on external address ADDn). In addition, in the present embodiment, the path on the decode signal Xm side is presumed to be faster than the path of the decode signal Xn side. Consequently, in contrast to multiplexer 8n being arranged at the latter stage of 1st address decoder 2n and 1st refresh address decoder 5n in the same manner as FIG. 1 in the path on the decode signal Xn side, in the path on the decode signal Xm side, 1st address decoder 2m is arranged at the latter stage of multiplexer 8m.

As a result of being composed in this manner, multiplexer 8m should switch the same number of signals as the number of bits of external address ADDm or refresh address RAm, and the number of multiplexers 8m should be provided so as to be equivalent to this number of bits. In addition, on the decode signal Xn side, it is not necessary to respectively provide a 1st address decoder on the external address side and refresh address side, and 1st address decoder 2m can be shared by both of these paths. For this reason, in comparison with the case of composing the decode signal Xm side in the same manner as the decode signal Xn side, both the number of signals and circuit size can be reduced.

[Third Embodiment]

In each of the embodiments starting with the present embodiment, explanations are provided in the case of applying the present invention to a semiconductor memory device having spare memory cells for remedying defects. As a result of applying the technical idea of arranging a decoder before a multiplexer as was previously proposed (Japanese Patent Application No. 2000-63936 filed on Mar. 8, 2000) to a semiconductor memory device according to the background art equipped with spare memory cells, the inventors of the present invention considered that those problems might be able to be solved in the same manner as the first and second embodiments.

Figure 17:
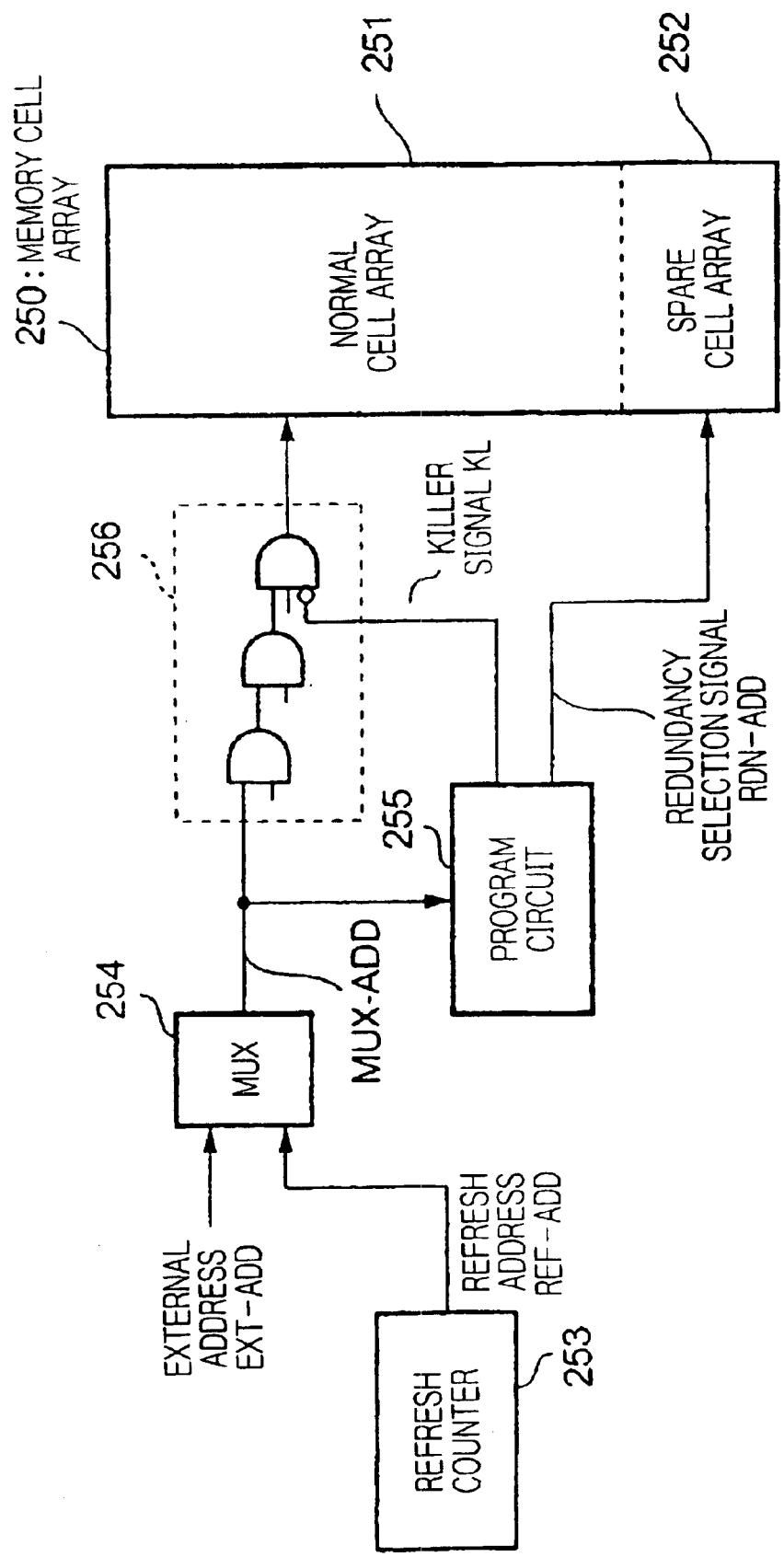
FIG. 17 is a block diagram showing the structure of a semiconductor memory device according to the background art equipped wit a spare memory cell array.

In the case of attempting to apply the above technical idea to a semiconductor memory device according to the background art equipped with spare memory cells, it was considered to arrange pre-decoders between external address EXT_ADD and multiplexer 254, and between refresh counter 253 and multiplexer 254, respectively, shown in FIG. 17, and use a main decoder instead of decoder 256. However, in such a structure, the number of signals input to multiplexer 254 by the pre-decoders increases. Consequently, the number of signals input to program circuit 255 also increases, and the number of fuse elements that compose program circuit 255 increase proportionately, thereby resulting in an increase in surface area.

In addition, in such a structure, program circuit 255 is arranged in the vicinity of the main decoder. However, since the decode circuit typically moves closer to the memory cell array as it is arranged at the latter stage (namely, the more it acts as a main decoder as compared with a pre-decoder), the layout of the main decoder becomes a regular layout according to the pitch of the memory cells. Consequently, the installation of a program circuit having a large surface area in close proximity to where the main decoder is arranged ends up having a considerable effect that far surpasses the effect of circuit size of the program circuit on chip surface area.

Moreover, in such a structure, the output of multiplexer 254 is input to both program circuit 255 and decoder 256, and program circuit 255 and decoder 256 operate in parallel. Consequently, if the delay caused by a comparison operation using fuse elements that is performed within program circuit 255 is smaller than the delay caused by the decoding operation of decoder 256, program circuit 255 is able to generate killer signal KL and redundancy selection signal RDN_ADD while decoder 256 is performing the decoding operation, thereby making it possible to ignore the operational delay of program circuit 255. However, in a structure in which decoders are divided into pre-decoders and a main decoder as described above, since the number of circuit stages of the main decoder can be reduced in comparison with decoder 256 as shown in FIG. 17, the delay caused by program circuit 255 can be made to be greater than the delay caused by the main decoder. In such case, even if killer signal KL is input to the main decoder, it is no longer possible to stop generation of a decode signal by killer signal KL. In order to avoid such a situation, it is necessary to delay the operation of generating the decode signal so that the main decoder outputs a decode signal after killer signal KL has been generated by program circuit 255. However, when this is done, the delay caused by decoder 256 increases resulting in a deterioration of characteristics in terms of access speed and so forth. Problems like those described above can also be solved by each of the embodiments starting with the present embodiment.

(Explanation of the Structure)

Figure 7:
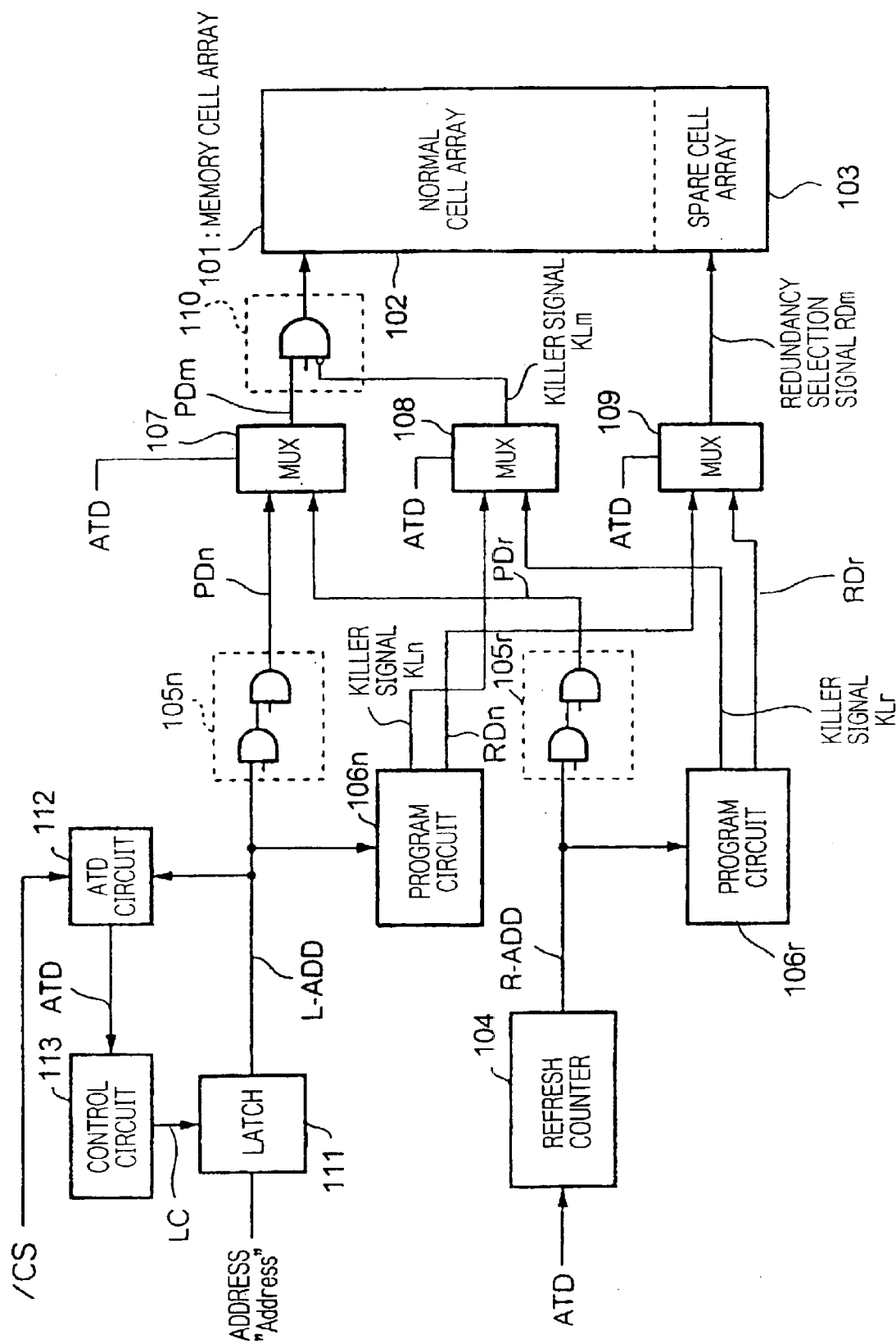
FIG. 7 is a block diagram showing the structure of a semiconductor memory device according to a third embodiment of the present invention.

FIG. 7 is a block drawing showing the essential portion of the structure of a semiconductor memory device according to the present embodiment. In this drawing, those constituent elements such as a sense amplifier provided in common with a general-purpose DRAM that are not directly related to the essential portion of the present invention are not shown. This applies similarly to each of the other embodiments to be described later. In FIG. 7, memory cell array 101 is composed of a plurality of memory cells that require refreshing at fixed time intervals in order to retain data in the same manner as general-purpose DRAM.

In addition, the memory cells of memory cell array 101 are arranged in the form of a matrix at those locations where word lines and pairs of bit lines, running in the row and column directions, respectively, intersect. Each memory cell uses a DRAM cell and so forth composed of one transistor and one capacitor. Furthermore, although the following explanation is provided on the assumption of an example of there being 4096 word lines (decimal, and this is to apply similarly to other values unless indicated otherwise), there may be any number of word lines.

Moreover, memory cell array 101 is composed of normal cell array 102 and spare cell array 103. Normal cell array 102 is equivalent to a memory cell array provided by a semiconductor memory device that does not employ a redundant structure, and is a memory cell array that is accessed in the absence of a failure in a memory cell corresponding to an address specified from the outside. On the other hand, spare cell array 103 is for replacing the region where there is a failure in memory cell units or line units in the case of a failure in normal cell array 102.

Although possible examples of structures for spare cell array 103 include a structure that provides spare memory cells in memory cell units, a structure that provides spare lines in word line units, a structure that provides spare lines in bit line pair units, and a structure that provides spare lines in both word line units and bit line units, respectively, any of these structures may be employed. In the present specification, an explanation is provided using as an example of one of these choices a constitution that provides spare lines in word line units.

In addition, in the present embodiment, each word line is composed hierarchically by a main word line and sub word lines, and for example, 8 sub word lines are connected per single main word line. Thus, the 4096 lines actually refer to the number of sub word lines, and the number of main word lines is equal to 4096/8 =512 lines. In addition, although the structure of spare cell array 103 allows replacement for up to, for example, 4 main word lines (32 sub word lines), the number of word lines that are replaced may be suitably increased or decreased.

As is clear from that described above, one main word line or eight sub word lines are replaced as a unit in the case a line in normal cell array 102 is replaced with a line in spare cell array 103. Furthermore, memory cell array 101 is accessed with an address including a row address for specifying a word line and a column address for specifying a bit line pair. Thus, the main word line is selected in accordance with bits other than the lower 3 bits of the row address, and each sub word line connected to the same main word line is selected in accordance with the lower 3 bits of the row address. Furthermore, the present invention is naturally not limited to a hierarchical type of word line structure.

Next, address "Address" is an access address given from the outside for normal access, and contains a row address and a column address. Next, refresh counter 104 generates refresh address R_ADD for refreshing memory cell array 101, and successively generates addresses while increasing in increments of "1" in the manner of "0", "1", "2", . . . , "4095", "0", . . . corresponding to the structure of normal cell array 102. Furthermore, refresh address R_ADD has the same bit width as the row address contained in address "Address".

Next, pre-decoder 105n pre-decodes the row address contained in address "Address" based on internal address L_ADD output from latch 111, and then outputs pre-decode signal PDn. Pre-decoder 105r is composed in the same manner as pre-decoder 105n, and outputs pre-decode signal PDr obtained by pre-decoding refresh address R_ADD. Furthermore, pre-decoders 105n and 105r are equivalent to 1st address decoder 2 and 1st refresh address decoder 5 in FIG. 1 (first embodiment), respectively.

Next, replacement information that determines whether or not each memory cell connected to a word line in normal cell array 102 is to be replaced with a memory cell connected to a word line of spare cell array 103 is pre-programmed in program circuit 106n. In the case of replacing a word line corresponding to a row address within address "Address", program circuit 106n validates killer signal KLn while also enabling redundancy selection signal RDn for identifying the word line used in spare cell array 103 (namely, the state of specifying the activation of a certain word line in spare cell array 103 after selecting the word line).

On the other hand, in the case replacement is not performed, program circuit 106n invalidates all killer signals KLn and redundancy selection signals RDn (namely, the state of specifying the non-selection of all word lines in spare cell array 103). Furthermore, if killer signal KLn is invalidated, it becomes "L", and if it is validated, it becomes "H", and this applies similarly to redundancy selection signal RDn. Next, program circuit 106r is composed in the same manner as program circuit 106n, and is pre-programmed with the same replacement information as program circuit 106n, generating killer signal KLr and redundancy selection signal RDr corresponding to the replacement information in accordance with refresh address R_ADD.

Next, multiplexer 107 selects pre-decode signal PDn in the case of normal access, or pre-decode signal PDr in the case of refreshing, in accordance with an address change detection signal (address transition detection signal) ATD (to be later described in detail) equivalent to a switching signal, and outputs one of these selected signals in the form of pre-decode signal PDm. Multiplexers 108 and 109 are composed in the same manner as multiplexer 107, with multiplexer 108 selecting killer signal KLn and killer signal KLr during normal access and refresh, respectively, followed by output of that signal as killer signal KLm.

In addition, multiplexer 109 selects redundancy selection signal RDn and redundancy selection signal RDr during normal access and refresh, respectively, and outputs that signal to a word driver on the spare side (not shown) as redundancy selection signal RDm. If either of redundancy selection signals RDm is validated, the spare side word driver activates the word line in spare cell array 103 corresponding to the valid redundancy selection signal RDm.

Next, in the case killer signal KLm is invalidated, main decoder 110 generates a decode signal by decoding pre-decode signal PDm and then drives a word driver on the normal side (not shown) by outputting the decode signal to that word driver. Furthermore, main decoder 110 is equivalent to the decoder contained within word driver 110 of FIG. 1 (first embodiment). The normal side word driver activates a word line in normal cell array 102 that is specified with this decode signal. In contrast, in the case killer signal KLm is validated, main decoder 110 does not activate any of the word lines in normal cell array 102 regardless of the value of pre-decode signal PDm.

In addition to the constituent elements described above, an address buffer that buffers address "Address", a sense amplifier that senses memory cell data by differentially amplifying the potential of a bit line pair, a pre-charge circuit that pre-charges a bit line pair to a voltage equal to one-half the power supply voltage, a column decoder that selects any of the sense amplifiers in accordance with the row address, and an I/O (input/output) buffer that buffers data input and output between a sensor amplifier and the outside and so forth are also provided.

However, all of these constituent elements are the same as those provided in general-purpose DRAM and so forth, and are not directly related to the essential operation of the present invention. Thus, these constituent elements are not shown in FIG. 7 to avoid excessive complexity. The structure explained thus far is also used in common in the case of applying the present invention to a general-purpose DRAM and an existing pseudo SRAM. In contrast, the constituent elements explained below are required for the realization of MSRAM. However, since it is extremely tedious to explain all of the constituent elements described in the above related invention, the explanation here is provided focusing primarily on those constituent elements related to the present invention.

To begin with, chip select signal/CS is a selection signal that is validated ("L") in the case the MSRAM chip shown is activated. Here, the symbol "/" appended to the front of the signal name means that the signal is a negative logic signal. Next, latch 111 incorporates address "Address" given from the outside with the rising edge of latch control signal LC that determines the latch timing, and respectively supplies the latched address to pre-decoder 105n, program circuit 106n and ATD circuit 112 in the form of an internal address L_ADD.

ATD (address transition detector) circuit 112 emits a one-shot pulse as address transition detection signal ATD if there is a change in any one of the bits of internal address L_ADD in the case chip select signal/CS is validated. In addition, ATD circuit 112 also emits a one-shot pulse as address transition detection signal ATD in the case chip select signal/CS has changed from the invalid state ("H") to the valid state.

Next, in addition to generating latch control signal LC, control circuit 113 supplies a row enable signal, sense amplifier enable signal, pre-charge enable signal, column enable signal and input/output control signal to peripheral circuits including main decoder 110, the above sense amplifier, pre-charge circuit, column decoder and I/O buffer, respectively. Here, an explanation is only provided with respect to the row enable signal and latch control signal LC that was previously mentioned in the first embodiment. To begin with, the row enable signal is a signal that activates a word line in memory cell array 101, and control circuit 113 validates this row enable signal in the case of activating a word line regardless of whether accessing normal cell array 102 or spare cell array 103, and regardless of refresh or normal access. Next, in addition to causing latch control circuit LC to rise by using the falling edge of address transition detection signal ATD as a trigger, control circuit 113 causes latch control signal LC to fall by using the falling edge of the column enable signal generated during normal access as a trigger.

(Explanation of Operation)

Figure 8:
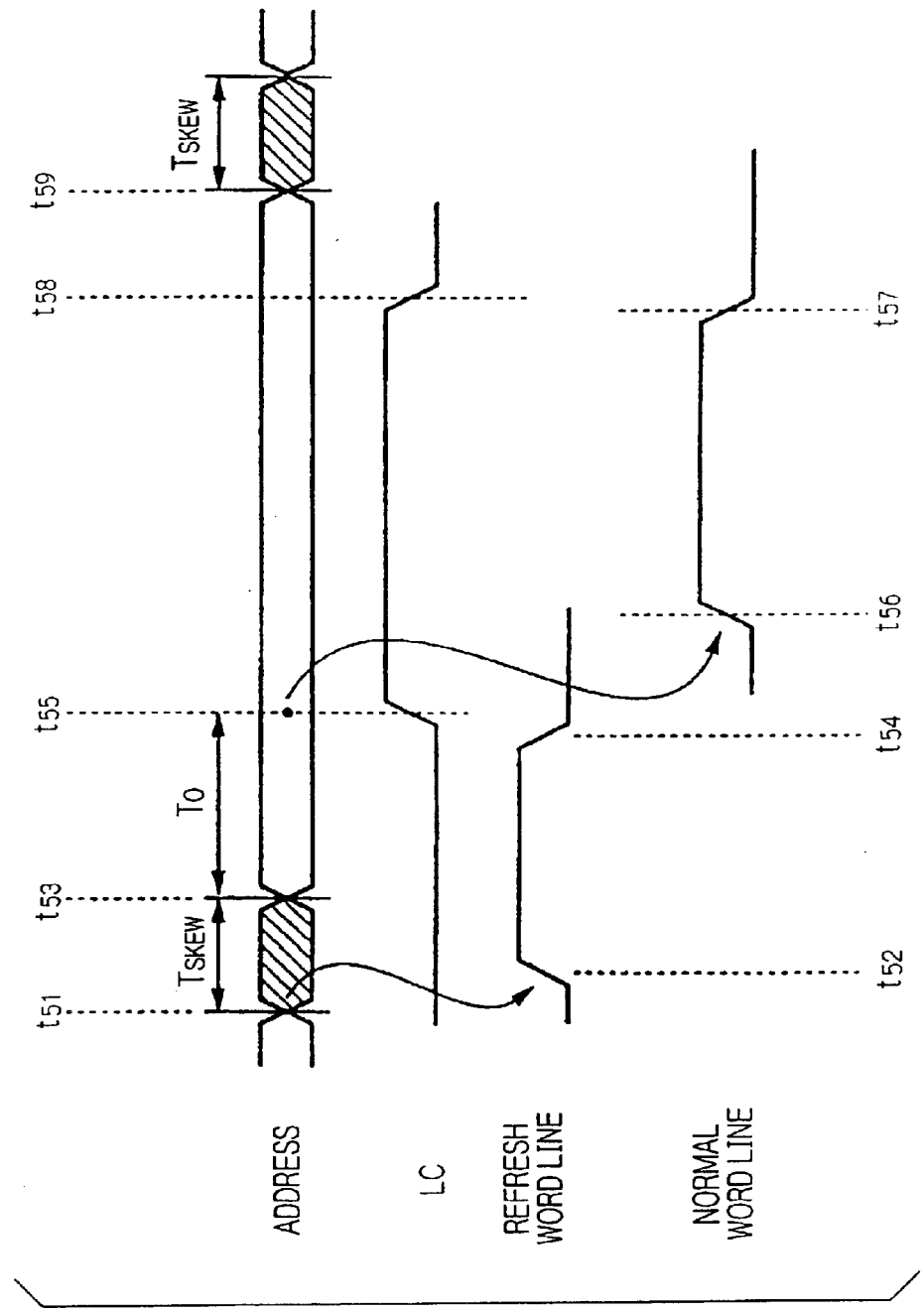
FIG. 8 is a timing chart showing the operation of a semiconductor memory device according to a third embodiment or fourth embodiment of the present invention.

Next, an explanation is provided of the operation of a semiconductor memory device according to the above structure while referring to the timing chart of FIG. 8. To begin with, since control circuit 113 outputs "L" for latch control circuit LC prior to time t51, latch 111 directly outputs address "Address" in the form of internal address L_ADD. As a result, the change in address "Address" directly becomes a change in internal address L_ADD, and is rapidly transmitted to ATD circuit 112.

When a new memory cycle is entered at time t51, in addition to address "Address" beginning to change, chip select signal/CS not shown is validated. Furthermore, the manner in which address "Address" is given may be by causing chip select signal/CS to change from the invalid state to the valid state after giving address "Address" in advance. Here, since there is a skew in address "Address" and chip select signal/CS, although the value of address "Address" may not always be defined at time t51, it is defined by time t53 following the passage of time $T_{SKEW}$ show in FIG. 8 from time t51. Furthermore, the period from time t51 to time t53 is hereinafter referred to as the address skew period.

Next, ATD circuit 112 detects a change in internal address L_ADD, and emits a one-shot pulse as address transition detection signal ATD. Whereupon, multiplexers 107 through 109 select signals on the refresh address side (namely, pre-decode signal PDr, killer signal KLr and redundancy selection signal RDr) in response to the rising edge of address transition detection signal ATD. As a result, the word line in normal cell array 102 corresponding to refresh address R_ADD is assumed to be a normal word line free of failure, and the normal cell array 102 side, and not the spare cell array 103 side, is refreshed.

In this case, program circuit 106r outputs the invalid killer signal KLr and the invalid redundancy selection signal RDr. As a result, multiplexer 108 outputs an invalid killer signal KLm, and multiplexer 109 outputs an invalid redundancy selection signal RDm. In addition, in parallel with the operation just described, pre-decoder 105r generates pre-decode signal PDr by pre-decoding refresh address R_ADD, and then inputs this to main decoder 110 as pre-decode signal PDm by way of multiplexer 107.

Here, invalid killer signal KLm is transmitted to main decoder 110 either simultaneous or prior to pre-decode signal PDm. In this case, since killer signal KLm is invalidated, main decoder 110 decodes pre-decode signal PDm and sends the resulting decode signal to the normal side word driver. As a result, the normal side word driver performs refreshing by activating the word line in normal cell array 102 specified with refresh address R_ADD. In addition, in this case, since redundancy selection signal RDm is also invalidated, the spare side word driver does not activate a word line of spare cell array 103.

Next, an explanation is provided of the detailed timing during refresh. To begin with, control circuit 113 generates a one-shot pulse as the row enable signal, and outputs it to main decoder 110. Whereupon, main decoder 110 decodes pre-decode signal PDm, and the normal side word driver activates a word line in normal cell array 102 at time t52 ("Refresh word line" in FIG. 8). As a result, the data of the memory cells connected to the word line is read out as the potentials of bit line pairs. Subsequently, control circuit 113 activates the sense amplifiers by outputting a sense amplifier enable signal to the sense amplifiers. Following this, the memory cells are actually refreshed in the same manner as general-purpose DRAM.

Furthermore, in the case a failed word line in normal cell array 102 has been specified as refresh address R_ADD, program circuit 106r outputs valid killer signal KLr. In addition, program circuit 106r outputs redundancy selection signal RDr for selecting a word line in spare cell array 103 to take the place of the word line specified with refresh address R_ADD. As a result, the valid killer signal KLm is output through multiplexer 108, and killer signal KLm is input to main decoder 110 either simultaneous or prior to pre-decode signal PDm.

Consequently, as a result of main decoder 110 putting all word lines in the non-selected state by making all decode signals "L", none of the word lines in normal cell array 102 are activated. On the other hand, redundancy selection signal RDr is supplied to the spare side word driver as redundancy selection signal RDm by way of multiplexer 109. Therefore, the spare side word driver refreshes by activating the word line in spare cell array 103 specified with redundancy selection signal RDm.

Subsequently, address "Address" used for the normal access (and thus, internal address L_ADD) is defined by time t53 when the address skew period is over. Therefore, pre-decoder 105n pre-decodes the defined internal address L_ADD to generate pre-decode signal PDn and then supplies that signal to multiplexer 107. In addition, program circuit 106n generates killer signal KLn and redundancy selection signal RDn in parallel with this operation.

If the word line in normal cell array 102 corresponding to address "Address is normal, program circuit 106n outputs an invalid killer signal KLn. In contrast, if the word line in normal cell array 102 corresponding to address "Address" has failed, program circuit 106n outputs valid killer signal KLn. Subsequently, control circuit 113 invalidates the row enable signal at the time the required time for refreshing has elapsed, and at time t54, deactivates the refresh word line while also deactivating the sense amplifiers by disabling the sense amplifier enable signal. As a result, refresh is completed, and control circuit 113 generates a pre-charge enable signal and pre-charges the bit line pairs.

Following this, in response to the falling edge of the one-shot pulse of address transition detection signal ATD, refresh counter 104 increases its own count value to prepare for the next refresh operation. In addition, in response to the falling edge of this address transition detection signal ATD, the internal operation of the semiconductor memory device switches from refresh operation to normal access operation. To begin with, when control circuit 113 raises latch control signal LC at time t55, latch 111 latches address "Address". As a result, internal address L_ADD is supplied thereafter to each section inside MSRAM until latch control signal LC falls, and is not affected by the change in address "Address" even if address "Address" changes.

In addition, multiplexer 107 through 109 select signals on the normal access side in response to the falling edge of address transition detection signal ATD. Consequently, pre-decode signal PDn and killer signal KLn are input to main decoder 110 as pre-decode signal PDm and killer signal KLm, respectively. In addition, redundancy selection signal RDn is input to the spare side word driver as redundancy selection signal RDm.

Here, killer signal KLm is transmitted to main decoder 110 simultaneous or prior to pre-decode signal PDm being supplied to main decoder 110. Consequently, in the case killer signal KLm is invalidated, main decoder 110 supplies the decode signal obtained by decoding pre-decode signal PDm to the normal side word driver. As a result, the normal side word driver performs normal access by activating the word line in normal cell array 102 specified with address "Address". At this time, since redundancy selection signal RDm is also invalidated, the spare side word driver does not activate any of the word lines of spare cell array 103.

On the other hand, in the case killer signal KLm is validated, since main decoder 110 makes all decode signals "L" to put all word lines in the non-selected state, the normal side word driver does not activate any of the word lines of normal cell array 102. In addition, a signal is output for redundancy selection signal RDm for selecting a word line in spare cell array 103 to take the place of the word line in normal cell array 102 specified with address "Address". Consequently, the spare side word driver performs normal access by activating the word line of spare cell array 103 specified with redundancy selection signal RDm.

Here, an explanation is provided of the detailed operation during normal access. To begin with, control circuit 113 generates a one-shot pulse as the row enable signal to start the decoding operation of main decoder 110. Here, if replacement by spare cell array 103 is assumed to not be performed, the normal side word driver activates the word line in normal cell array 102 ("Normal word line" in FIG. 8) corresponding to address "Address" at time t56. Furthermore, operation is nearly the same even if replacement is performed, with spare cell array 103 being activated instead of normal cell array 102.

Here, in the case the access request from the outside is, for example, reading, control circuit 113 activates the sense amplifiers. As a result, the sense amplifiers output the data of respective memory cells connected to the normal word line by sensing the potentials of the bit line pairs. Next, control circuit 113 generates a one-shut pulse for the column enable signal to activate a column decoder, and among the activated sense amplifiers, selects the output of the sense amplifier corresponding to the memory cell specified with address "Address", and then outputs its output to the outside by way of an I/O buffer.

Furthermore, in the case of writing as well, the operation is similar to that of reading. In this case, a write enable signal and write data are given asynchronously at the timing by which address "Address" changes. During the time the write enable signal is validated, write data is written by way of the I/O buffer, sense amplifiers and bit line pairs into the memory cells in memory cell array 101 specified with address "Address".

When reading or writing is carried out in this manner, control circuit 113 deactivates the normal word line at time t57 in the same manner as in the case of refresh. Next, control circuit 113 pre-charges the bit line pairs after deactivating the sense amplifiers and column decoder. Here, control circuit lowers latch control signal LC at time t58 in response to the falling edge of the column enable signal in order to deactivate the column decoder. As a result, the change in address "Address" can be rapidly transmitted to ATD circuit 112 in preparation for the next memory cycle starting at time t59.

As has been described above, in the present embodiment, the normal access side decoders are divided into pre-decoders and a main decoder. The pre-decoders are made to be arranged closer to the input side (address "Address" side) than the multiplexers that switch the signal on the external address side and signal on the refresh address side. Here, in a semiconductor memory device according to the background art as previously described, since the decoders are arranged at the latter stage of the multiplexers, decoder operation was unable to be started until after address "Address" is defined.

In contrast, in the present embodiment, as long as address "Address" is defined at time t53, pre-decoding operation, killer signal generation operation and redundancy selection signal generation operation can be performed within the period of time $T_0$ (time t53–t55) during which refresh is performed. Consequently, only the decoding operation by main decoder 110 need be performed starting from time t55 when operation switches from refresh to normal access. Thus, access can be accelerated and cycle time can be shortened as compared with a semiconductor memory device according to the background art.

[Fourth Embodiment]
(Explanation of Structure)

Figure 9:
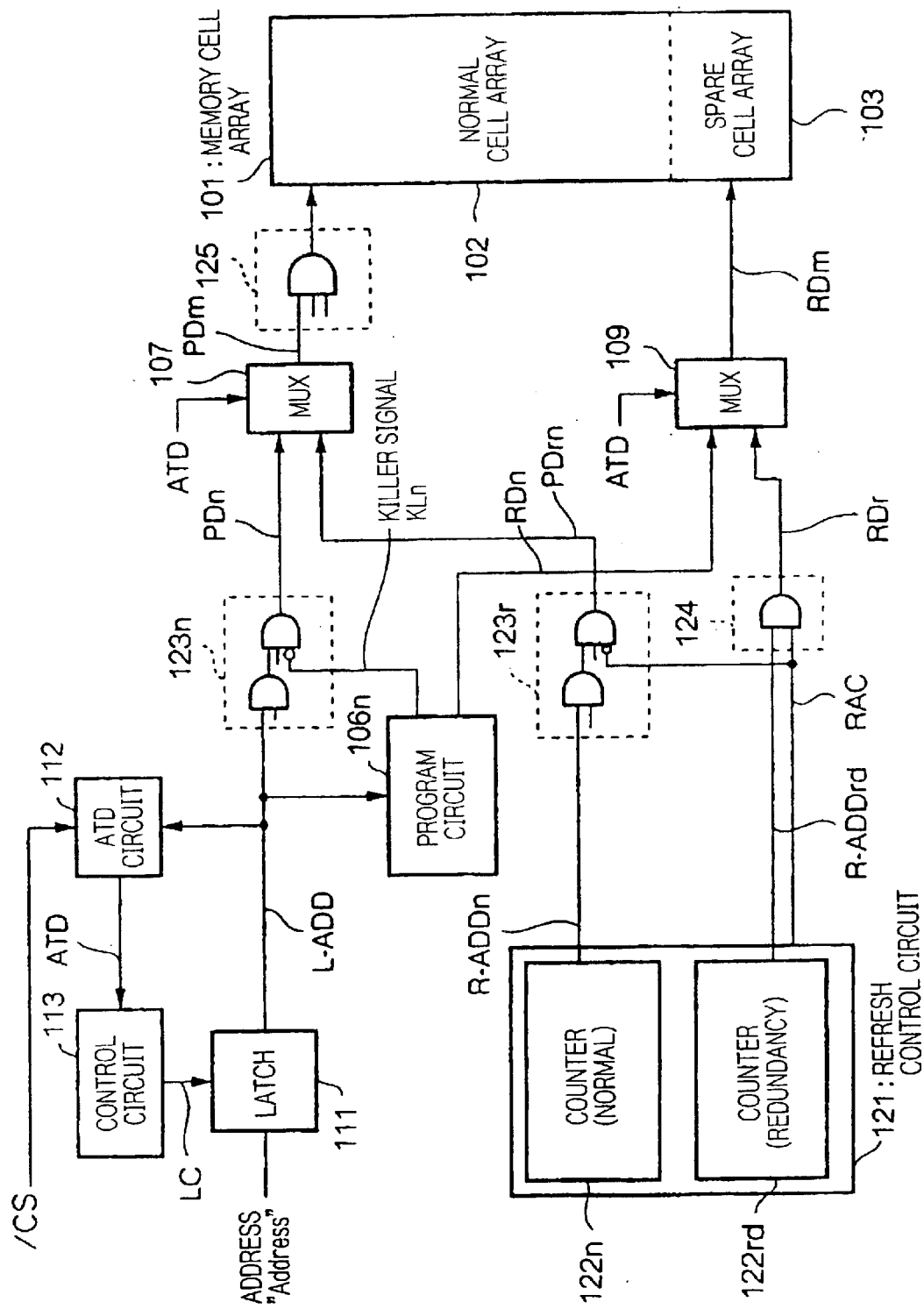
FIG. 9 is a block diagram showing the structure of a semiconductor memory device according to a fourth embodiment of the present invention.

FIG. 9 is a block diagram showing the structure of a semiconductor memory device according to the present embodiment, and the same reference symbols are assigned to those constituent elements that are the same as those shown in FIG. 7 (third embodiment). To begin with, in the present embodiment, program circuit 106r and multiplexer 108 provided in FIG. 7 are not present. In addition, all word lines of memory cell array 101 are not refreshed in the third embodiment. In other words, failed word lines in normal cell array 102 and word lines in spare cell array 103 that do not replace normal cell array 102 are not refreshed. Consequently, a total of 4096 word lines are eligible for refreshing throughout memory cell array 101.

In contrast, in the present embodiment, all word lines are refreshed regardless of the presence or absence of a failure and regardless of replacement. For example, the operation of refreshing all word lines in normal cell array 102 followed by refreshing all word lines in spare cell array 103 is repeated. Thus, in the present embodiment, a total of 4128 (=4096+32) word lines are eligible for refresh throughout memory cell array 101.

Consequently, in the present embodiment, counter 122n and counter 122rd are respectively provided within refresh control circuit 121 as independent refresh counters for normal cell array 102 and spare cell array 103. Counter 122n generates refresh address R_ADDn for refreshing normal cell array 102. Since normal cell array 102 is equipped with 4096 sub word lines, refresh address R_ADDn changes in the manner of "0", "1", . . . , "4095", "0", . . . for each refresh. On the other hand, counter 122rd generates refresh address R_ADDrd for refreshing spare cell array 103. Since spare cell array 103 is equipped with 32 sub word lines, refresh address R_ADDrd changes in the manner of "0", "1", . . . , "31", "0", . . . for each refresh.

Furthermore, in the present embodiment, normal cell array 102 and spare cell array 103 are not simultaneously refreshed, and during the time one of counters 122n and 122*rd* is counting, the other counter discontinues the counting operation. Consequently, refresh control circuit 121 generates a refresh address control signal RAC that indicates which of normal cell array 102 or spare cell array 103 is eligible for refresh. Furthermore, if refresh address control signal RAC is "L", counter 122*n* is able to count, while if refresh address control signal RAC is "H", counter 122*rd* is able to count.

Next, although pre-decoder 123*n* is composed in the nearly the same manner as pre-decoder 105*n* of FIG. 7, killer signal KLn is input to pre-decoder 123*n*. Consequently, although pre-decoder 123*n* outputs a valid pre-decode signal PDn in exactly the same manner as pre-decoder 105*n* if killer signal KLn is invalidated ("L"), if killer signal KLn is validated ("H"), it outputs an invalid pre-decode signal PDn.

Pre-decoder 123*r* is also composed in nearly the same manner as pre-decoder 105*r* of FIG. 7. However, in the present embodiment, since normal cell array 102 and spare cell array 103 are alternately refreshed, refresh address control signal RAC is input to pre-decoder 123*r*. Although a valid pre-decode signal PDrn is output in the same manner as pre-decoder 105*r* if refresh address control signal RAC is "L", if refresh address control signal RAC is "H", an invalid pre-decode signal PDrn is output.

Next, in the case decoder 124 refreshes spare cell array 103 (refresh address control signal RAC is "H"), it outputs a valid redundancy selection signal RDr by decoding refresh address R_ADDrd. On the other hand, in the case of refreshing normal cell array 102 (refresh address control signal RAC is "L"), decoder 124 outputs an invalid redundancy selection signal RDr. Next, main decoder 125 drives the normal side word driver by decoding pre-decode signal PDm.

Figure 10:
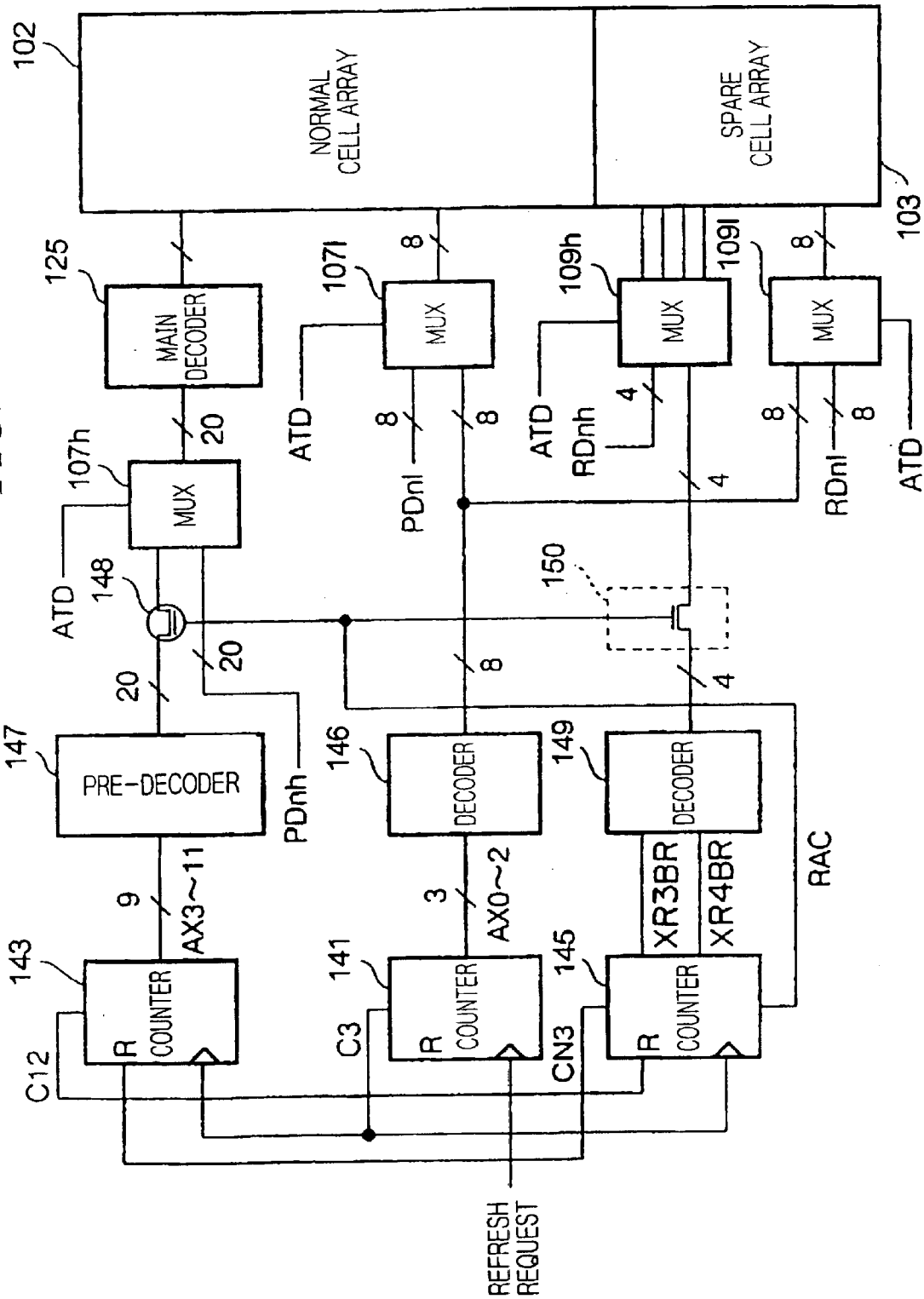
FIG. 10 is a block diagram showing a specific example of the structure of a semiconductor memory device according to the fourth embodiment of the present invention with respect to the hierarchical word line structure.

Here, FIG. 10 provides a more detailed illustration of the structure of FIG. 9, and is an example of a structure corresponding to a hierarchical word line structure composed of a main word line and sub word lines. Furthermore, the same reference symbols are used in FIG. 10 for the same constituent elements as those shown in FIG. 7 or FIG. 9. Similar to the second embodiment (FIG. 6), the structure of FIG. 10 has different numbers of decoder stages depending on the decode signal routes, with there being 1 stage for the lower 3 bits of the external address/refresh address, and 2 stages for the upper 9 bits.

As has been described above, both in normal cell array 102 and spare cell array 103, one main word line is composed of eight sub word lines. Consequently, in FIG. 10, the counter for normal cell array 102 and the counter for spare cell array 103 are not completely independent. Namely, counter 141 for consecutively refreshing the sub word lines connected to the same word line is shared by normal cell array 102 and spare cell array 103. Thus, during refreshing of normal cell array 102, the combination of counter 141 and counter 143 serves as the refresh counter, and during refreshing of spare cell array 103, the combination of counter 141 and counter 145 serves as the refresh counter.

Here, each bit of refresh address R_ADDn shown in FIG. 9 is assumed to be AX0–AX11 (where AX0 is the least significant bit and AX11 is the most significant bit). Counter 141 is a 3-bit binary counter that increases its count each time one sub word line is refreshed. Together with generating addresses AX0–AX2, this counter 141 generates a pulse as carry C3 when its count value is wrapped around to "000"B (where B refers to a binary number).

Next, counter 143 is a 9-bit (=12 bits-3 bits) binary counter for generating addresses AX3–AX11. This counter 143 increases its count each time a pulse is generated to carry C3. In addition, this counter 143 generates a pulse as carry C12 when the count value wraps around to "0 . . . 0" B, while at the same time interrupting its own counting operation. After its counting operation has been interrupted, counter 143 is transformed into a state in which counting can be resumed when a pulse is input to reset terminal R. In other words, when refreshing of spare cell array 103 is completed and a pulse is generated as carry CN3 by counter 145 described below, counter 143 is again used to refresh normal cell array 102.

Next, counter 145 is a binary counter that generates the two highest bits of refresh address R_ADDrd. This counter 145 outputs addresses XR3BR and XR4BR while increasing its count each time a pulse is generated as carry C3. In addition, counter 145 generates a pulse as carry CN3 when its count value wraps around to "00" B, while simultaneously interrupting its own counting operation. After it has interrupted its counting operation, counter 145 is transformed into the state in which counting can be resumed when a pulse is input to reset terminal R.

In other words, when refreshing of normal cell array 102 is completed and counter 143 generates a pulse as carry C12, counter 145 is again used to refresh spare cell array 103. In addition, counter 145 also generates refresh address control signal RAC based on whether it has interrupted its own counting operation. Furthermore, immediately after the power has been turned on, control circuit 113 shown in FIG. 9, for example, supplies a pulse to either reset terminal R of counter 143 or counter 145 to set whether normal cell array 102 or spare cell array 103 is to be initially refreshed.

Next, decoder 146 generates eight decode signals by decoding addresses AX0–AX2, and supplies these decode signals to the normal side word driver and spare side word driver, respectively, through multiplexer 1071 and multiplexer 1091. Multiplexer 1071 selects either the decode signal output from decoder 146, or decode signal PDnl obtained by decoding the lower 3 bits of internal address L_ADD, in accordance with address transition detection signal ATD.

In addition, multiplexer 1091 selects the decode signal output from decoder 146 or redundancy selection signal RDnl in accordance with address transition detection signal ATD. Here, program circuit 106*n* of FIG. 9 is composed so as to output redundancy selection signal RDnh for selecting the main word line and redundancy selection signal RDnl for selecting the sub word lines. Normal cell array 102 and spare cell array 103 then select sub word lines according to the decode signals supplied from multiplexer 1071 and multiplexer 1091, respectively.

Next, pre-decoder 147 supplies a pre-decode signal obtained by pre-decoding addresses AX3–AX11 to multiplexer 107*h* through transistor (which may be abbreviated as "Tr") 148 described below. Multiplexer 107*h* then selects this pre-decode signal and pre-decode signal PDnh obtained by pre-decoding the upper 9 bits of internal address L_ADD in accordance with address transition detection signal ATD, and outputs the selected pre-decode signal to main decoder 125. Here, pre-decoder 147 divides the 9 bits of addresses AX3–AX11 into 2, 3, 2 and 2 bits, and generates 4, 8, 4 and 4 decode signals, respectively, resulting in the output of a total of all 20 signal combined as the pre-decode signal.

Next, Tr 148 is a p-channel MOS (metal oxide semiconductor) transistor, is provided in a number equal to the number of pre-decode signals output by pre-decoder 147, and transmits these pre-decode signals to multiplexer 107*h* when refresh address control signal RAC is "L". Next, decoder 149 decodes addresses XR3BR and XR4BR, and outputs four decode signals.

Next, switch 150 is composed of four n-channel MOS transistors, and transmits the output of decoder 149 to multiplexer 109h when refresh address control signal RAC is "H". Next, multiplexer 109h selects either the redundancy selection signal supplied through switch 150 or redundancy selection signal RDnh, and supplies the selected redundancy selection signal to the spare side word driver.

According to the above constitution, the normal side word driver activates any one of the sub word lines specified by decoder 146 among the sub word lines connected to the main word line specified by main decoder 125 in accordance with each decoded result of main decoder 125 and decoder 146. The spare side word driver similarly activates any of the sub word lines according to each decoded result of decoder 149 and decoder 146.

(Explanation of Operation)

Next, an explanation is provided of the operation of the semiconductor memory device according to the above structure while referring to the timing chart of FIG. 8 that is the same as the third embodiment. Here, an operation is first provided following the structure of FIG. 9, after which a supplementary explanation is provided of the operation of the structure of FIG. 10. To begin with, prior to time t51, address "Address" is supplied to each portion of the latter stage by passing through latch 111. At time t51, when address "Address" begins to change, since a one shot pulse is generated as address transition detection signal ATD, multiplexers 107 and 109 select pre-decode signal PDrn and redundancy selection signal RDr, respectively, in response to the generation of that pulse.

Here, if normal cell array 102 is refreshed first, refresh control circuit 121 outputs "L" for refresh address control signal RAC. Consequently, when pre-decoder 123r generates pre-decode signal PDrn from refresh address R_ADDn (for example, "0") output from counter 122n, it is input directly to main decoder 125 from multiplexer 107 as pre-decode signal PDm. As a result, the word line corresponding to row address "0" in normal cell array 102 is activated resulting in refreshing. On the other hand, since decoder 124 generates an invalid redundancy selection signal RDr, none of the word lines in spare cell array 103 are activated. Furthermore, the details of the refresh operation are the same as the refresh operation of the third embodiment.

If internal address L_ADD is defined by time t53, pre-decoder 123n generates pre-decode signal PDn from internal address L_ADD. In addition, program circuit 106n generates killer signal KLn and redundancy selection signal RDn in parallel with this operation. Thus, although program circuit 106n generates a valid pre-decode signal PDn when killer signal KLn is invalid, it generates an invalid pre-decode signal PDn when killer signal KLn is valid. In addition, program circuit 106n generates a valid redundancy selection signal RDn at this time.

Next, when the amount of time required for refreshing elapses, refreshing is terminated in the same manner as the third embodiment. Next, at time t55, latch control signal LC rises and operation switches from refresh to normal access. Accompanying this, multiplexers 107 and 109 are made to select signals on the normal access side, and pre-decode signal PDn and redundancy selection signal RDn are supplied to main decoder 125 and the spare side word driver, respectively, as pre-decode signal PDm and redundancy selection signal RDm.

In addition, counter 122n increases refresh address R_ADDn and outputs a "1" in preparation for refreshing the next sub word line. Next, control circuit 113 begins the decoding operation of main decoder 125. Here, if replacement by spare cell array 103 is assumed to not be performed, main decoder 125 decodes pre-decode signal PDm. As a result, the normal word line corresponding to address "Address" is activated and normal access is performed.

On the other hand, in the case of performing replacement, since a valid pre-decode signal PDm is not generated, none of the word lines of normal cell array 102 are activated. Instead, since redundancy selection signal RDm is validated, the word line on spare cell array 103 corresponding to address "Address" is activated and normal access is performed. Furthermore, the detailed operation of normal access is the same as the third embodiment. Subsequently, after the time required for normal access elapses, normal access is terminated in the same manner as the third embodiment. As a result, together with the normal word line being activated, latch control signal LC falls and the memory cycle switches at time t59.

This is followed by repetition of the operation just described, and refresh is performed in manner described below. Namely, refresh address R_ADDn increases one at a time each time refresh is performed, and when its value reaches "4095" and the corresponding word line is refreshed, the count value of counter 122n returns to "0". As a result, refresh control circuit 121 interrupts the counting operation of counter 122n and instead, puts counter 122rd into the countable state and resets its count value to "0".

Simultaneous to this, since refresh control circuit 121 switches refresh address control signal RAC to "H", decoder 124 decodes refresh address R_ADDrd and supplies the resulting redundancy selection signal RDr to multiplexer 109. On the other hand, pre-decoder 123r no longer generates a valid pre-decode signal PDrn. In the case refresh is subsequently performed, multiplexer 109 supplies a valid redundancy selection signal RDr to the spare side word driver as redundancy selection signal RDm. As a result, the word line in spare cell array 103 corresponding to value "0" of refresh address R_ADDrd is refreshed.

Subsequently, counter 122rd increases its count by "1" for every refresh. When the value of refresh address R_ADDrd reaches "3" and the corresponding word line is refreshed, the count value of counter 122rd returns to "0". As a result, refresh control circuit 121 interrupts the counting operation of counter 122rd, again puts counter 122n into the countable state and resets its count value to "0". At the same time, refresh control circuit 121 switches refresh address control signal RAC to "L". Since the operation returns to the initially explained state as a result of this series of operations, the following operation is a repetition of the operation previously described.

Furthermore, an explanation is now provided of the refresh operation in the case of employing the structure of FIG. 10. Here as well, normal cell array 102 is assumed to be refreshed first, and the count values of counters 141, 143 and 145 are all "0" as the initial state. Since the operation of counter 145 is interrupted at this time, "L" is being output for refresh address control signal RAC. Consequently, switch 150 is off and none of the decode signals generated by decoder 149 are transmitted to multiplexer 109h.

The output of counter 141 is inherently supplied to spare cell array 103 via multiplexer 109l after being decoded with decoder 146. However, in memory cell array 101, even if a sub word line is selected, unless the main word line is selected, none of the sub word lines connected to that main word line are activated. Thus, even if a decode signal is supplied from decoder 146, none of the word lines are activated in spare cell array 103.

On the other hand, Tr 148 is turned on as a result of refresh address control signal RAC becoming "L". Consequently, the output of counter 143 is pre-decoded with pre-decoder 147, after which it is decoded by being input to main decoder 125 via Tr 148 and multiplexer 107$h$. At this time, the decode signal output by decoder 146 is supplied to normal cell array 102 through multiplexer 107*l*. As a result, the word line of normal cell array 102 corresponding to row address "0" is refreshed.

Subsequently, as a result of the count of counter 141 increasing, the values of addresses AX0–AX11 become "1". As a result, the word line of normal cell array 102 corresponding to row address "1" is refreshed in the next refresh operation. Since counter 141 generates carry C3 when the word line corresponding to row address "7" is subsequently refreshed in the same manner, counter 143 increases its count and addresses AX3–AX11 become "1". As a result, the word line of normal cell array 102 corresponding to row address "8" is refreshed in the next refresh operation.

An operation similar to that just described is subsequently performed, and each time the 8 sub word lines connected to the same main word line are refreshed, carry C3 is generated and the count of counter 143 increases. When the values of AX0–AX11 reach "4095" (when all of the bits of counters 141 and 143 are "1" B) and the corresponding refresh operation is completed, together with counter 141 generating carry C3, counter 143 generates carry C12. As a result, while counter 143 interrupts its own counting operation, counter 145 is shifted to the countable state, and "H" is output for refresh address control signal RAC.

Whereupon, Tr 148 is now cut-off and switch 150 is turned on. As a result, a valid pre-decode signal is no longer supplied from multiplexer 107$h$ to main decoder 125. Thus, none of the word lines in normal cell array 102 are activated even if a decode signal is transmitted from decoder 146 through multiplexer 107*l*. On the other hand, as a result of switch 150 being turned on, the value "0" of counter 145 is supplied to decoder 149, and decoder 149 supplies the generated decode signal to the spare side word driver by way of multiplexer 109$h$.

As a result, together with the word line in spare cell array 103 corresponding to row address "0" being refreshed, counter 141 increases its own count value to "1". As a result, the word line in spare cell array 103 corresponding to row address "1" is refreshed in the next refresh operation. Operation is subsequently repeated in the same manner, and when the word line corresponding to row address "7" is refreshed, counter 141 generates carry C3. As a result, counter 145 increases its count and outputs "01"B.

As a result, the word line in spare cell array 103 corresponding to row address "8" is refreshed. A similar operation is subsequently repeated and when the word line corresponding to row address "31" is refreshed, counter 145 generates carry CN3. As a result, together with counter 145 interrupting its own counting operation, refresh address control signal RAC is changed to "L". On the other hand, counter 143 is again shifted to the countable state due to generation of carry CN3. As a result, operation again returns to the initial state and is repeated in the same manner as previously described.

As has been described above, in the present embodiment, cycle time can be shortened since access is faster than in the semiconductor memory device according to the background art in the same manner as the third embodiment. In addition, since refresh is performed throughout the entire memory cell array 101 in the present embodiment, it offers the advantage of not requiring the providing of a separate refresh program circuit 106$r$ as in the third embodiment.

Here, since program circuits typically require a large number of fuses, roughly several tens of fuses must be provided easily causing the circuit to become quite large even if there are only 4 main word lines of spare cell array 103 as in the present embodiment. Consequently, the chip area also increases. However, according to the present embodiment, since only one program circuit is required, in addition to the circuit being composed smaller than in the third embodiment making it advantageous in terms of area, access speed can still be increased in the same manner as the third embodiment.

In addition, in the semiconductor memory device and so forth according to the background art, a killer signal is input to a decoder of a latter stage in the circuit than a multiplexer in order to cover the delay mediated by a program circuit. Consequently, in the third embodiment for example, multiplexer 108 is required for switching the killer signals. In contrast, in the present embodiment, killer signal KLn is input to pre-decoder 123*n* arranged closer to the input side than multiplexer 107, and the generation of a valid pre-decode signal is prohibited. Consequently, in the present embodiment, it is not necessary to provide a multiplexer for the killer signals, thereby enabling the circuit size to be made smaller and chip area to be reduced as compared with the third embodiment and so forth.

[Fifth Embodiment]

In the present embodiment, latches for holding pre-decode signals and redundancy selection signals inside a multiplexer are provided for the external address and refresh address, respectively. Whereupon, spare time is created during which the path extending from the input stage to the multiplexer is not used.

Pre-decode and redundancy selection signals corresponding to address "Address" are generated during the period in which refresh is performed prior to normal access, are incorporated in the latch for the external address, and are used in normal access following refreshing. On the other hand, pre-decode and redundancy selection signals corresponding to the refresh address are generated during the period of normal access, are incorporated in the latch for refreshing, and are used in refreshing of the next memory cycle.

(Explanation of the Structure)

Figure 11:
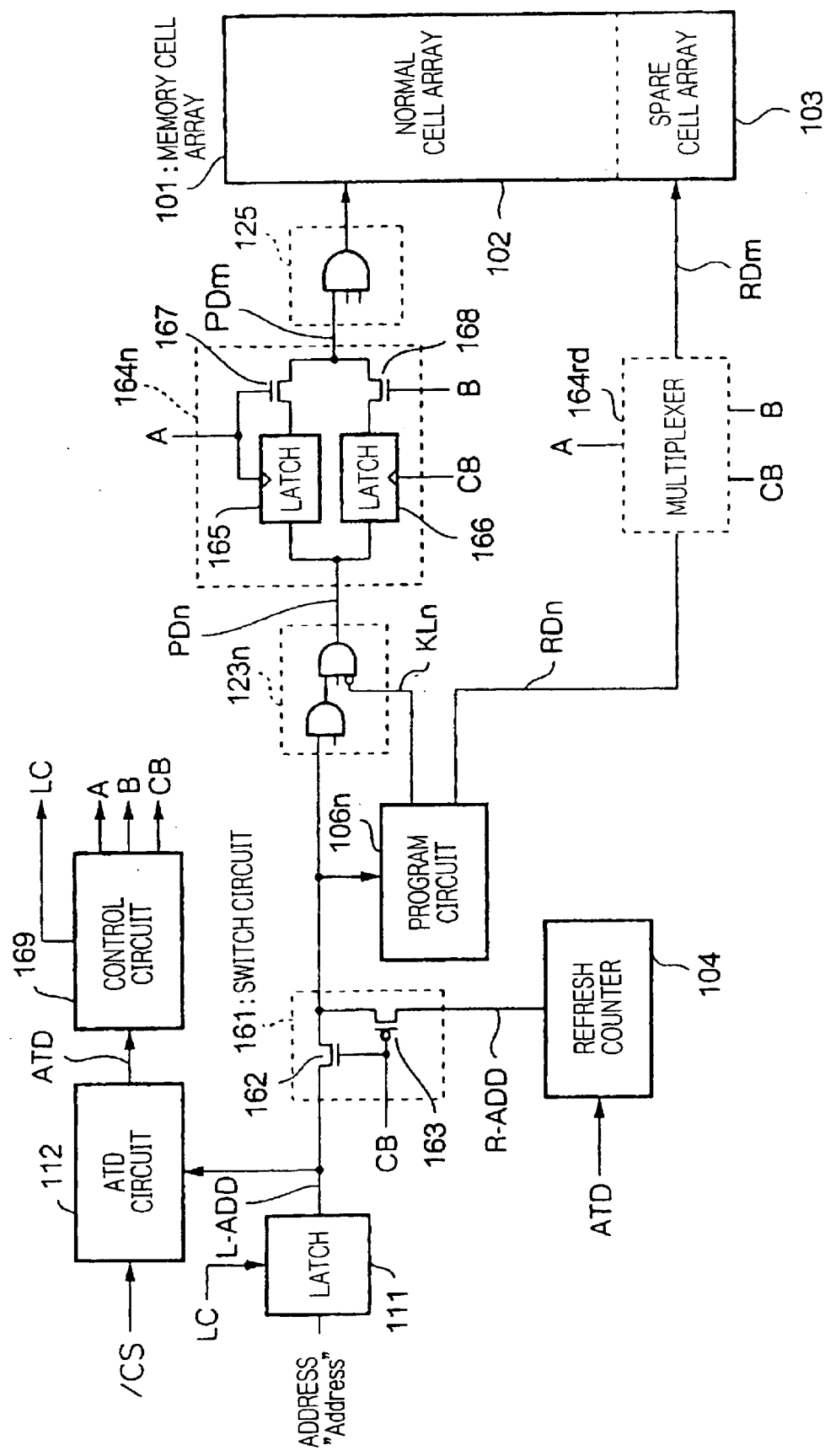
FIG. 11 is a block diagram showing the structure of a semiconductor memory device according to a fifth embodiment of the present invention.

FIG. 11 is a block diagram showing the structure of a semiconductor memory device according to the present embodiment, and the same reference symbols are used for those constituent elements that are the same as those shown in FIG. 7 (third embodiment) or FIG. 9 (fourth embodiment). In the present embodiment, pre-decoder 123*r* and pre-decoder 124 shown in FIG. 9 are not provided. In their place, switch circuit 161 is provided at the latter stage of the node in which address "Address" (internal address L_ADD) is supplied to ATD circuit 112.

In addition, refresh counter 104 shown in FIG. 7 is provided instead of refresh control circuit 121 shown in FIG. 9, and its output is supplied to switch circuit 161 instead of a multiplexer. In other words, in the present embodiment, failed word lines in normal cell array 102 and word lines not used for replacement in spare cell array 103 are not refreshed in the same manner as the third embodiment.

Next, control signal CB is a signal for selecting either internal address L_ADD or refresh address R_ADD. Switch circuit 161 is equipped with Tr 162 and Tr 163 for which switching state is controlled by control signal CB, with the former being an n-channel MOS transistor, and the latter being a p-channel MOS transistor. When control signal CB is "H", Tr 162 and Tr 163 are on and off, respectively, and internal address L_ADD is transmitted to a latter stage. On the other hand, when control signal CB is "L", Tr 162 and Tr 163 are off and on, respectively, and refresh address R_ADD is transmitted to a latter stage.

Next, since multiplexers 164n and 164rd are composed in exactly the same manner, only a detailed circuit example of multiplexer 164n is shown in FIG. 11. Multiplexer 164n is composed of latch 165, latch 166, Tr 167 and Tr 168, and both of these transistors are n-channel MOS transistors. Here, control signal A is "H" during the period of normal access to memory cell array 101, and is "L" at all other times. Latch 165 incorporates pre-decode signal PDn using the rising edge of this control signal A as a trigger. Next, Tr 167 outputs the held contents of latch 165 as pre-decode signal PDm during the period of normal access when control signal A is "H".

Next, control signal B is "H" during the period in which memory cell array 101 is refreshed, and is "L" at all other times. Latch 166 incorporates pre-decode signal PDn using the rising edge of control signal CB as a trigger. Next, Tr 168 outputs the held contents of latch 166 as pre-decode signal PDm during the refresh period when control signal B is "H". Subsequently, control circuit 169 generates control signals A, B and CB using the rising edge of address transition detection signal ATD as a trigger. Other functions of control circuit 169 are the same as control circuit 113 of FIG. 7. Furthermore, the timing at which control circuit 169 generates these control signals is explained in the next section on the explanation of operation. Furthermore, control signals A and B are equivalent to external address transmission signal EXTR and refresh address transmission signal RFTR, respectively, shown in FIG. 1.

(Explanation of Operation)

Figure 12:
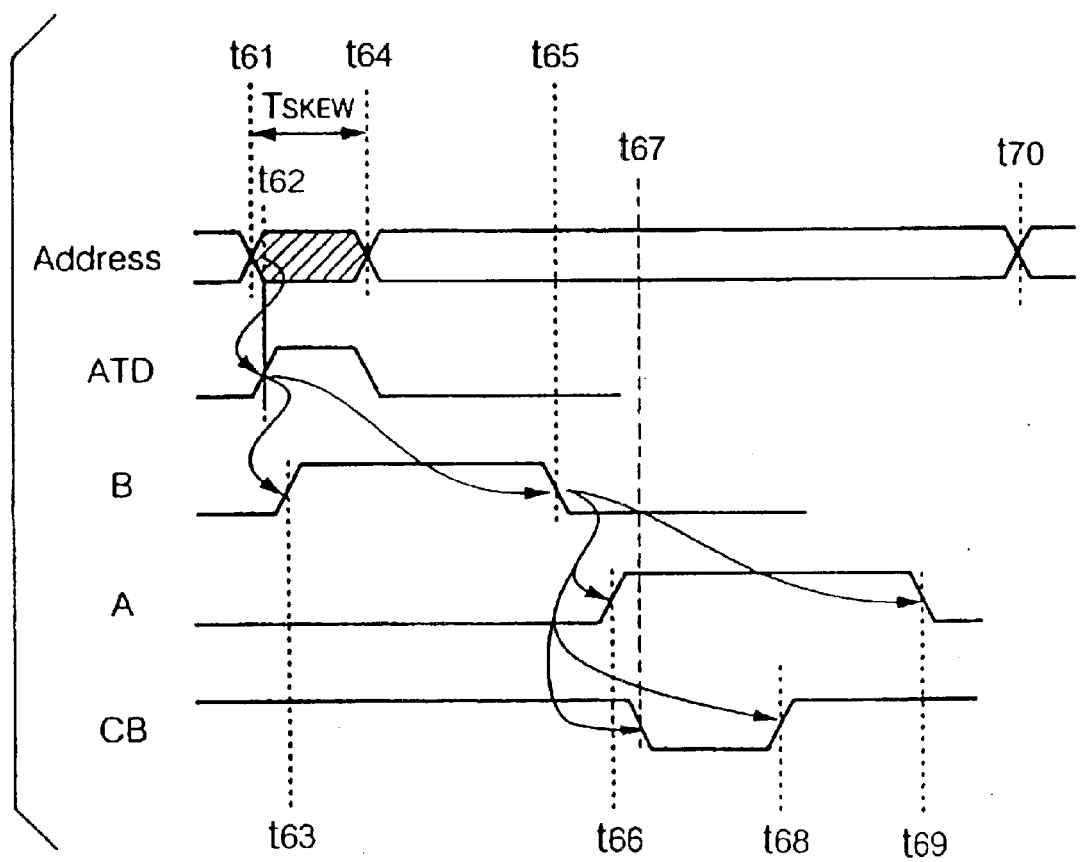
FIG. 12 is a timing chart showing the operation of a semiconductor memory device according to a fifth embodiment of the present invention.

Next, an explanation is provided of the operation of the semiconductor memory device according to the present embodiment with reference to the timing chart of FIG. 12. Pre-decode signal PDn and redundancy selection signal RDn corresponding to refresh address R_ADD are assumed to be incorporated in latches 166 within multiplexers 164n and 164rd, respectively. Here, the incorporation operations of each latch 166 are the same as those at time t68 to be described later, and here, incorporation into latches 166 is carried out in a memory cycle prior to the memory cycle shown in FIG. 12.

In addition, since control signals A, B and CB are "L", "L" and "H", respectively, at this time, switch circuit 161 selects the address "Address" side, and the outputs of the two latches within multiplexers 164n and 164rd are not supplied to main decoder 125 and the spare side word driver. To begin with, when address "Address" begins to change at time t61, ATD circuit 112 generates a one-shot pulse for address transition detection signal ATD at time t62. Whereupon, control circuit 169 causes control signal B to rise at time t63 using the rising edge of this one-shot pulse as a trigger.

In the case the word line in normal cell array 102 corresponding to refresh address R_ADD is assumed to be normal, pre-decode signal PDn was valid and redundancy selection signal RDn was invalid at the time of incorporation into latches 166 in a previous memory cycle. Thus, in this case, main decoder 125 decodes pre-decode signal PDm, and the normal side word driver refreshes the word line of the normal cell array corresponding to refresh address R_ADD.

On the other hand, in the case there is a failure in the word line in normal cell array 102 corresponding to refresh address R_ADD, pre-decode signal PDn was invalid and redundancy selection signal RDn was valid at the time incorporation into latches 166 was performed in a previous memory cycle. Thus, in this case, since the spare side word driver decodes redundancy selection signal RDm, a substitute word line is refreshed in spare cell array 103.

Next, when address "Address" is defined at time t64 after time $T_{SKEW}$ has elapsed from time t61, this address "Address" is supplied to pre-decode circuit 123n and program circuit 106 through switch circuit 161. Consequently, the value of address "Address" is pre-decoded, and the resulting pre-decode signal PDn is output. In addition, if the word line in normal cell array 102 corresponding to address "Address" has failed, killer signal KLn and redundancy selection signal RDn are validated, and if it has not failed, killer signal KLn and redundancy selection signal RDn are both invalidated.

When refreshing is subsequently completed, control circuit 169 discontinues supplying pre-decode signal PDm by causing control signal B to lower at time t65 by using the rising edge of address transition detection signal ATD as a trigger. Next, control circuit 169 causes control signal A to rise at time t66 using the falling edge of control signal B as a trigger. As a result, each latch 165 within multiplexers 164n and 164rd incorporates pre-decode signal PDn and redundancy selection signal RDn, respectively, corresponding to address "Address", and input these to main decoder 125 and the spare side word driver as pre-decode signal PDm and redundancy selection signal RDm, respectively.

As a result, if a word line in normal cell array 102 corresponding to address "Address" is normal, since pre-decode signal PDn is validated, normal access is performed for normal cell array 102. Next, at time t67, control circuit 169 causes control signal CB to fall using the falling edge of control signal B as a trigger. As a result, switch circuit 161 selects the refresh address R_ADD side. As a result, similar to the case of address "Address" having been given, pre-decode signal PDn is generated that has pre-decoded refresh address R_ADD. At this time, if the word line in normal cell array 102 corresponding to refresh address R_ADD has failed, killer signal KLn and redundancy selection signal RDn are validated, while pre-decode signal PDn is invalidated.

Subsequently, control circuit 169 causes control signal CB to rise at time t68 using the falling edge of control signal B as a trigger. Here, the negative pulse width generated for control signal CB is set for at least the amount of time pre-decode signal PDn and redundancy selection signal RDn propagate to each latch 166 in multiplexer 164n and multiplexer 164rd, respectively, based on the time at which refresh address R_ADD is output by switch circuit 161. Each latch 166 in multiplexers 164n and 164rd then incorporate pre-decode signal PDn and redundancy selection signal RDn for refreshing at the rising edge of control signal CB.

The signals incorporated by each latch 166 in this manner are used during the period control signal B is "H" in next memory cycle in which refresh is performed. Subsequently, when normal access is completed and control circuit 169 causes control signal A to fall at time t69 using the falling edge of control signal B as a trigger, operation returns to the same state as time t61 and shifts to a new memory cycle at time t70. Thus, the operation is then repeated in the same manner as previously described.

As has been described above, in the present embodiment, not only the program circuit, but also the pre-decoder are shared in the case of performing refresh and in the case of performing normal access. Consequently, together with the same advantages as the fourth embodiment being obtained, the pre-decoder for the refresh address can be omitted when compared with the structure of the fourth embodiment. Consequently, circuit size can be further reduced and chip area can also be further decreased.

Furthermore, in the structure shown in FIG. 11, the technical idea of the present embodiment that uses latches can also be applied to a semiconductor memory device that does not have a spare cell array 103 by omitting the constituent elements for redundancy such as program circuit 106n and multiplexer 164rd.

In addition, although a specific explanation has not been provided for latch control signal LC, the timing of latch control signal LC and control signal A are nearly the same. Thus, the structure may be employed so as to latch in either latch 111 or multiplexer 164n.

[Sixth Embodiment]

The present embodiment is a variation of the fifth embodiment that is able to realize the same function as the fifth embodiment. Namely, in the present embodiment, during the refresh period of each memory cycle, the pre-decode signal and redundancy selection signal used the next time refresh is performed are generated and incorporated in a first latch within a multiplexer. In addition, the pre-decode signal and redundancy selection signal used during the refresh period are transferred from the first latch to a second latch separate from it at the start of refresh, and the output of this second latch is used during the refresh period.

This being the case, even if the first latch performs an incorporation operation during the refresh period, the pre-decode signal and redundancy selection signal supplied to the memory cell array 101 side during the refresh period are no longer affected. In addition, since normal access begins immediately after refresh is completed, in the present embodiment, switching from the refresh address side to the external address side is performed prior to the time of refresh completion. A pre-decode signal and redundancy selection signal corresponding to the external address are generated and transmitted to the input terminal of the multiplexer, and at the time normal access has begun, these pre-decode and redundancy selection signal can be immediately used for normal access.

Figure 13:
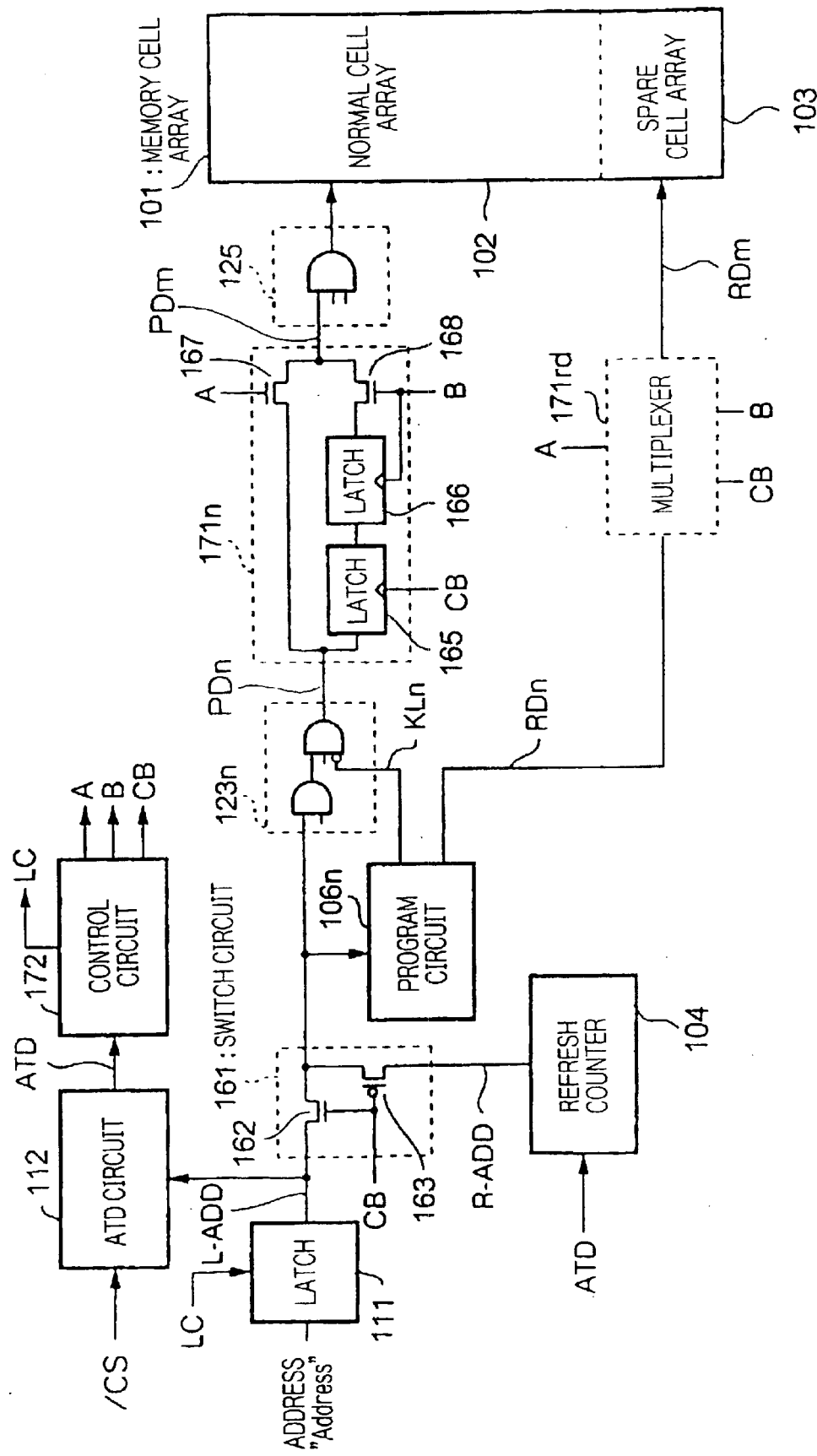
FIG. 13 is a block diagram showing the structure of a semiconductor memory device according to a sixth embodiment of the present invention.

FIG. 13 is a block diagram showing the structure of a semiconductor memory device according to the present embodiment, and the same reference symbols are used for those constituent elements that are the same as those shown in FIG. 11 (fifth embodiment). As can be understood from the drawing, in the present embodiment, the structure of the multiplexer differs from the structure shown in FIG. 11. Here, multiplexers 171n and 171rd have identical structures, with multiplexer 171rd being different from multiplexer 171rd only with respect to input and output of the redundancy selection signal instead of the pre-decode signal. Thus, an explanation of the detailed structure is only provided here for multiplexer 171n.

To begin with, in the case of normal access, since control signal A is "H", multiplexer 171n outputs pre-decode signal PDn through Tr 167 as pre-decode signal PDm. On the other hand, in the case of refresh, latches 165 and 166 and Tr 168 are used. Latch 165 is for incorporating pre-decode signal PDn used for the next refresh at the rising edge of control signal CB during the refresh period, and its contents are transferred to latch 166 with the rising edge of control signal B when refresh starts. On the other hand, latch 166 transmits the pre-decode signal to a latter stage through Tr 168 when control signal B is "H" during the refresh period. Furthermore, the functions of control circuit 172 are the same as those of control circuit 169 in FIG. 12 with the exception of the timing at which control signals A, B and CB are generated being different from control circuit 69.

Figure 14:
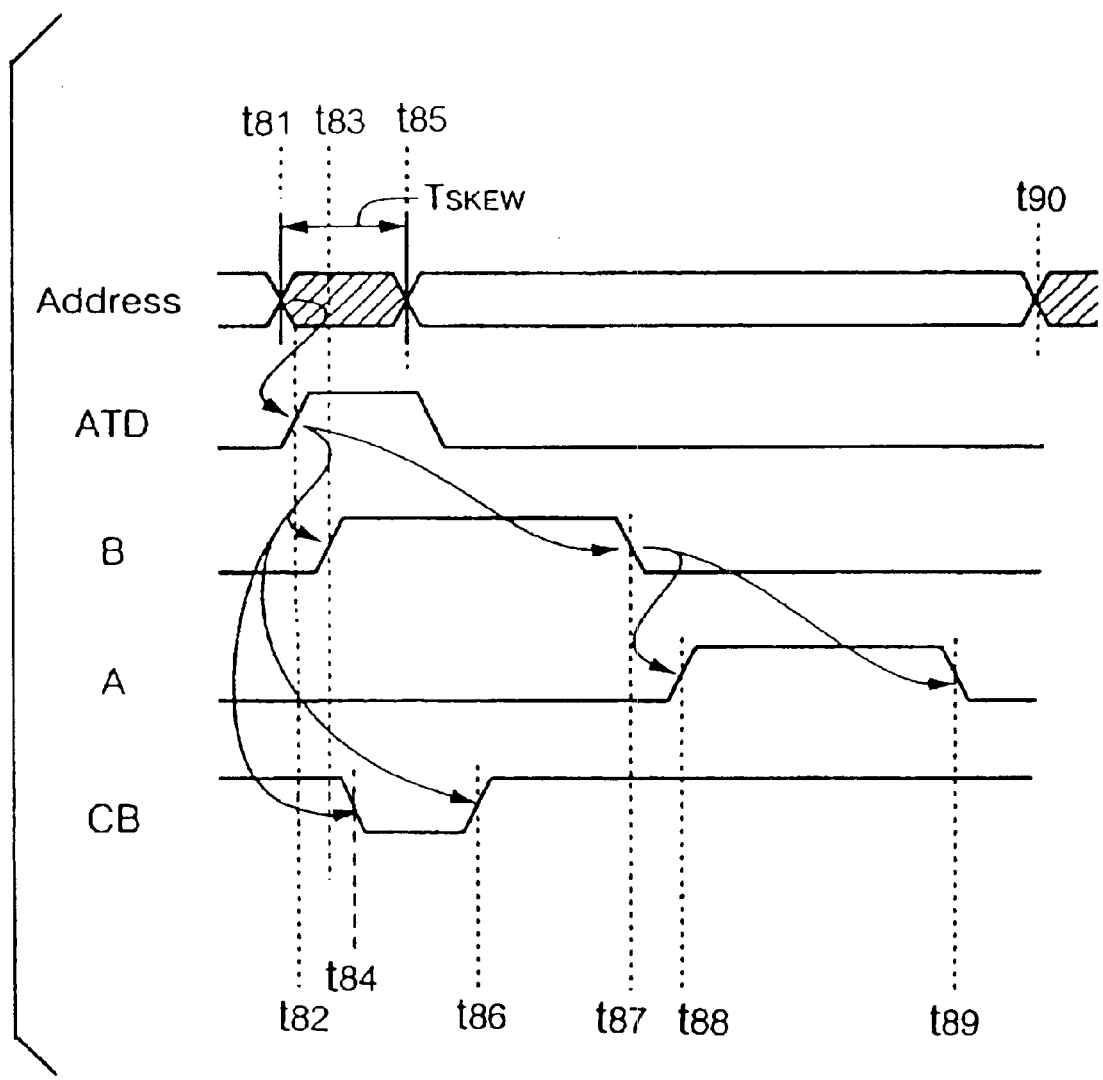
FIG. 14 is a timing chart showing the operation of a semiconductor memory device according to a sixth embodiment of the present invention.
Figure 15:
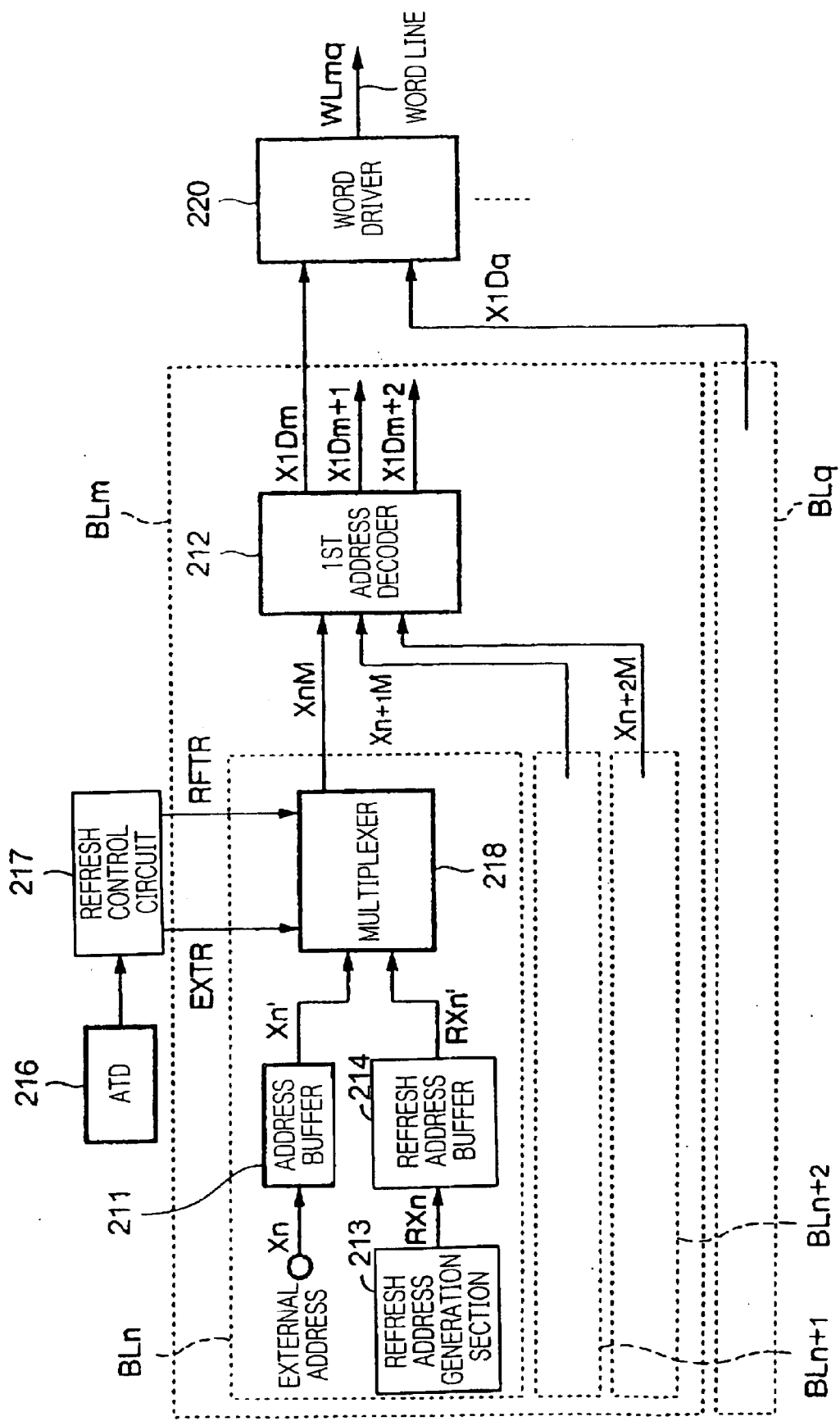
FIG. 15 is a block diagram showing the structure of a semiconductor memory device for realizing the address access method according to the background art.

Next, the operation of the semiconductor memory device according to the present embodiment is explained focusing primarily on differences with the fifth embodiment while referring to the timing chart of FIG. 14. To begin with, the levels of control signals A, B and CB prior to time t81 are the same as the fifth embodiment. Consequently, switch circuit 161 selects the internal address L_ADD side, and neither of the outputs of the two latches in multiplexers 171n and 171rd are supplied to main decoder 125 and the spare side word driver.

When address "Address" begins to change at time t81, a one-shot pulse is generated for address transition detection signal ATD at time t82. As a result, control circuit 172 causes control signal B to rise at time t83 by using the rising edge of address transition detection ATD as a trigger. Whereupon, latch 166 within multiplexer 171n incorporates the contents of latch 165, and transmits it to main decoder 125 via Tr 168 as pre-decode signal PDm corresponding to refresh address R_ADD.

Operation similar to multiplexer 171n is also performed in multiplexer 171rd, and redundancy selection signal RDm corresponding to refresh address R_ADD is transmitted to the spare side word driver. Assuming that, for example, the word line in normal cell array 102 corresponding to refresh address R_ADD is normal, pre-decode signal PDm is pre-decoded, and the word line of normal cell array 102 is refreshed. Next, at time t84, control circuit 172 causes control signal CB to fall by using the rising edge of address transition detection signal ATD as a trigger.

As a result, switch circuit 161 selects refresh address R_ADD, and pre-decoder 123n pre-decodes refresh address R_ADD and generates pre-decode signal PDn. In parallel with this, program circuit 106n generates killer signal KLn and redundancy selection signal RDn corresponding to refresh address R_ADD. Similar to the fifth embodiment, these operations are completed by the time control circuit 172 causes control signal CB to rise at time t86 using the rising edge of address transition detection signal ATD as a trigger.

As a result of the rise of control signal CB, each latch 165 in multiplexers 171n and 171rd incorporate pre-decode signal PDn and redundancy selection signal RDn, respectively, corresponding to refresh address R_ADD. In addition, as a result of control signal CB rising, switch circuit 161 selects the address "Address" side. As a result, pre-decode signal PDn and redundancy selection signal RDn corresponding to address "Address" are generated and input to multiplexers 171n and 171rd, respectively.

Subsequently, refresh is completed and control circuit 172 causes control signal B to fall at time t87 using the rising edge of the address transition detection signal ATD as a trigger. Next, when control circuit 172 causes control signal A to rise at time t88 using the falling edge of control signal B as a trigger, pre-decode signal PDn and redundancy selection signal RDn corresponding to address "Address" passes through Tr 167 within multiplexers 171n and 171rd, respectively, and are supplied to main decoder 125 and the spare side word driver as pre-decode signal PDm and redundancy selection RDm, respectively.

Consequently, if, for example, the word line in normal cell array 102 corresponding to address "Address" is normal, normal access is performed for the word line in normal cell array 102. When normal access is subsequently completed, control circuit 172 causes control signal A to fall at time t89 using the falling edge of control signal B as a trigger. As a result, since the operation returns to the same state as at time t81, the same operation as previously described is repeated after operation has shifted to the next memory cycle at time t90.

Furthermore, as can be understood from the above explanation, the negative pulse width generated for control signal CB is set to be equal to or greater than the time required for pre-decode signal PDn and redundancy selection signal RDn corresponding to refresh address R_ADD to reach latches 165 within multiplexers 171n and 171rd. Similarly, the time from the rise of control signal CB to the rise of control signal A (time t86–t88) is set to be equal to or greater than the time required for pre-decode signal PDn and redundancy selection signal RDn corresponding to address "Address" to reach main decoder 125 and the spare side word driver.

In addition, among the constituent elements shown in FIG. 13, by eliminating those constituent elements for redundancy such as program circuit 106n and multiplexer 171rd, the technical idea of the present embodiment that uses latches can also be applied to a semiconductor memory device that does not have a spare cell array 103.

[Variations]

Among the third through sixth embodiments, a killer signal is input to a pre-decoder to prohibit the generation of a pre-decode signal in all but the third embodiment. However, an embodiment may be composed, for example, such that a killer signal is input to a multiplexer arranged at latter stages of the pre-decoder so that the multiplexer does not transfer a valid pre-decode signal to the latter stages.

In addition, it was explained in the fourth embodiment that all word lines of spare cell array 103 are refreshed after all word lines of normal cell array 102 are refreshed. However, the order of refreshing is not limited to this. For example, refresh may be made to be performed such that normal cell array 102 and spare cell array 103 are alternately refreshed for every one to a plurality of word lines or for every one to a plurality of sub word lines. In other words, in the fourth embodiment, refresh should be performed for all of the sub word lines in memory cell array 101 within a predetermined amount of time.

In addition, in each of the above embodiments, normal cell array 102 and spare cell array 103, including peripheral circuits such as the sense amplifier, pre-charge circuit and column decoder, may be made to be independent, and refresh may be made to be performed in parallel for normal cell array 102 and spare cell array 103. As a result of refreshing normal cell array 102 and spare cell array 103 simultaneously, although peak current increases during that time, the number of word lines of spare cell array 103 is extremely small as compared with the number of word lines of normal cell array 102. Thus, the increase in peak current should be within a range that does not present a problem.

In addition, although the decoding operation in each of the above embodiments is divided between a pre-decoder and main decoder, all decoding operations may be made to be performed in the above pre-decode stage without dividing into two stages.

In addition, although the multiplexers are switched by an ATD signal in the above third and fourth embodiments, switching may also be controlled by external address transmission signal EXTR and refresh address transmission signal RFTR by using multiplexers of the structure shown in FIG. 5 in the same manner as the first embodiment (FIG. 1).

Although the above has provided a detailed description of the operation of each embodiment of the present invention with reference to the drawings, the present invention is not limited to these embodiments, but rather design changes and so forth are also included in the present invention provided they do not deviate from the gist of the present invention.

Industrial Application

The present invention provides technology that is capable of accelerating address access and shortening cycle time while decreasing the size of the circuit configuration as much as possible and reducing chip area by decoding an external address supplied from outside a semiconductor memory device and a refresh address generated within a semiconductor memory device for refreshing memory cells, followed by switching these decode signals.

What is claimed is:

1. A semiconductor memory device that performs a refresh operation and a read/write operation is provided with:

a decoder that respectively outputs decoded address signals by decoding an access address for the read/write operation and a refresh address for the refresh operation;

a first switching circuit that switches the decoded address signals; and a control circuit that performs the refresh operation or the read/write operation based on the switched decoded address signal.

2. The semiconductor memory device according to claim 1 that is further provided with a memory cell array having a normal cell array and a spare cell array that replaces a failed region in the normal cell array, wherein the first switching circuit switches the decoded address signals according to a switching signal that specifies which of the refresh operation or the read/write operation is to be performed, and the control circuit accesses the normal cell array or the spare cell array in accordance with the switched decoded address signal in accordance with the presence or absence of a failure in a region in the normal cell array that is the target of the refresh operation or the read/write operation.

3. The semiconductor memory device according to claim 2 that is further provided with:

a refresh address generation circuit that generates the refresh address corresponding to the structure of the normal cell array, a program circuit that generates killer signals that prohibit selection of the normal cell array and selection signals that specify the replacement region in the spare cell array for each of the refresh address and the access address according to the need for replacement, and a second switching circuit that respectively performs switching of the killer signals and switching of the selection signals according to the switching signal;

wherein the control circuit determines the access target to be either the normal cell array or the spare cell array based on the switched killer signal and selection signal.

4. The semiconductor memory device according to claim 2 that is further provided with:

a refresh address generation circuit that generates the refresh address corresponding to the normal cell array and the spare cell array that compose the memory cell array, a program circuit that generates a killer signal that prohibits selection of the normal cell array and a first selection signal that specifies the replacement region in the spare cell array for the access address in accordance with the need for replacement, and supplies the killer signal to the decoder, a selection signal generation circuit that generates a second selection signal that specifies a refresh region in the spare cell array based on the refresh address generated for the refresh operation of the spare cell array, and a second switching circuit that switches to either the first selection signal or the second selection signal in accordance with the switching signal;

wherein when accessing the spare cell array, the control circuit accesses a replacement region or refresh region in the spare cell array that is specified by either the switched first selection signal or the switched second selection signal.

5. A semiconductor memory device that performs a refresh operation and a read/write operation is provided with:

a selection circuit that selects either a refresh address for the refresh operation or an access address for the read/write operation, a decoder that decodes the selected refresh address or the access address and outputs decoded address signals, a first switching circuit that selects one of decoded address signals respectively generated for the refresh address and the access address prior to the refresh operation or the read/write operation when performing the refresh operation or the read/write operation, respectively, and a control circuit that performs the refresh operation or the read/write operation based on the selected decoded address signal.

6. The semiconductor memory device according to claim 5, wherein the first switching circuit is provided with:

a first retention circuit that incorporates the decoded address signal obtained by switching the selection circuit to the access address side during the period of the refresh operation, and outputs the decoded address signal during the period of the read/write operation, and a second retention circuit that incorporates the decoded address signal obtained by switching the selection circuit to the refresh address side during the period of the read/write operation, and outputs the decoded address signal during the period of the refresh operation.

7. The semiconductor memory device according to claim 5, wherein the first switching circuit is provided with:

a first retention circuit that incorporates the decoded address signal obtained by switching the selection circuit to the refresh address side during the period of the refresh operation, a second retention circuit that incorporates and outputs the output of the first retention circuit prior to the incorporation operation of the first retention circuit during the period of the refresh operation, and a transmission circuit that outputs the decoded address signal during the period of the read/write operation that is obtained by switching the selection circuit to the access address side during the period of the refresh operation.

8. The semiconductor memory device according to claim 5 that is further provided with: a memory cell array having a normal cell array and a spare cell array that replaces a failed region in the normal cell array, wherein the control circuit accesses the normal cell array or the spare cell array in accordance with the selected decoded address signal corresponding to the presence or absence of a failure in a region in the normal cell array that is the target of the refresh operation or the read/write operation.

9. The semiconductor memory device according to claim 8 that is further provided with:

a refresh address generation circuit that generates the refresh address corresponding to the structure of the normal cell array;

a program circuit that generates a killer signal that prohibits selection of the normal cell array and a selection signal that specifies the replacement region in the spare cell array for the address selected with the selection circuit in accordance with the need for replacement, and supplies the killer signal to the decoder; and a second switching circuit that selects one of the selection signals respectively generated for the refresh address and the access address prior to the refresh operation or the read/write operation when respectively performing the refresh operation or the read/write operation, wherein the control circuit determines the access target to be either the normal cell array or the spare cell array based on the selected decoded address signal and the selection signal.

10. The semiconductor memory device according to claim 9, wherein the first retention circuit incorporates the decoded address signal and the selection signal obtained by switching the selection circuit to the access address side during the period of the refresh operation, and outputs the decoded address signal and the selection signal during the period of the read/write operation, and the second retention circuit incorporates the decoded address signal and the selection signal obtained by switching the selection circuit to the refresh address side during the period of the read/write operation, and outputs the decoded address signal and the selection signal during the period of the refresh operation.

11. The semiconductor memory device according to claim 9, wherein the first retention circuit incorporates the decoded address signal and the selection signal obtained by switching the selection circuit to the refresh address side during the period of the refresh operation, the second retention circuit incorporates and outputs the decoded address signal and the selection signal output from the first retention circuit prior to the incorporation operation of the first retention circuit during the period of the refresh operation, and the transmission circuit outputs the decoded address signal and the selection signal during the period of the read/write operation that are obtained by switching the selection circuit to the access address side during the period of the refresh operation.

12. The semiconductor memory device according to claim 9, wherein the program circuit supplies the killer signal to the first switching circuit, and the first switching circuit outputs a decode signal that prohibits selection of the normal cell array when the killer signal is validated.

13. The semiconductor memory device according to claim 1 or 5 that is further provided with an address transition detection circuit that detects a change in the access address or the validation of an activation signal as an address transition, wherein the control circuit performs the refresh operation and the read/write operation using the address transition as a trigger.

14. The semiconductor memory device according to claim 13, wherein the control circuit performs the read/write operation after performing the refresh operation using the address transition as a trigger.

15. The semiconductor memory device according to claim 14, wherein the decoder generates the decoded address signal by performing a decoding operation during the period from the time the access address is defined until the time the read/write operation is started.

16. The semiconductor memory device according to any of claims 3, 4 or 9 that is further provided with an address transition detection circuit that detects a change in the access address or the validation of an activation signal as an address transition, wherein the control circuit performs the read/write operation after performing the refresh operation using the address transition as a trigger, and the program circuit generates the killer signal and the selection signal during the period from the time the access address is defined until the time the read/write operation is started.

17. The semiconductor memory device according to claim 1 or 5 that is further provided with a circuit arranged at the latter stage of the first switching circuit, and further decodes the decoded address signal obtained by the decoding operation by the decoder.

18. The semiconductor memory device according to claim 1 or 5, wherein a word line is selected based on a plurality of decoded address signals, and the position of the first switching circuit is determined for each route for obtaining the plurality of decoded address signals.

19. The semiconductor memory device according to claim 1 or 5, wherein the first switching circuit selects none of the decoded address signals over a prescribed period when the first switching circuit switches the decoded address signals.

20. The semiconductor memory device according to any of claims 3, 4 or 9, wherein the second switching circuit selects none of the killer signals and the selection signals over a prescribed period when the second switching circuit switches the killer signals and the selection signals.

21. The semiconductor memory device according to claim 19, wherein the first switching circuit outputs a voltage which puts a word line into a non-selected state during the prescribed period.

22. The semiconductor memory device according to claim 20, wherein the second switching circuit outputs a voltage which puts a word line into a non-selected state during the prescribed period.

23. The semiconductor memory device according to claim 1 or 5, wherein the control circuit performs the refresh operation and the read/write operation within the period of one memory cycle in a memory cycle in which the refresh operation is performed.

* * * * *